US011769751B2

(12) United States Patent
Elsherbini et al.

(10) Patent No.: US 11,769,751 B2
(45) Date of Patent: Sep. 26, 2023

(54) MICROELECTRONIC ASSEMBLIES

(71) Applicant: Intel Corporation, Santa Clara, CA (US)

(72) Inventors: Adel A. Elsherbini, Chandler, AZ (US); Shawna M. Liff, Scottsdale, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 461 days.

(21) Appl. No.: 16/649,949

(22) PCT Filed: Dec. 29, 2017

(86) PCT No.: PCT/US2017/068900
§ 371 (c)(1),
(2) Date: Mar. 23, 2020

(87) PCT Pub. No.: WO2019/132956
PCT Pub. Date: Jul. 4, 2019

(65) Prior Publication Data
US 2020/0279829 A1    Sep. 3, 2020

(51) Int. Cl.
*H01L 25/065* (2023.01)
*H01L 23/538* (2006.01)

(52) U.S. Cl.
CPC ........ *H01L 25/065* (2013.01); *H01L 23/5383* (2013.01); *H01L 23/5389* (2013.01)

(58) Field of Classification Search
None
See application file for complete search history.

(56) References Cited

U.S. PATENT DOCUMENTS 7,605,625 B2 * 10/2009 Pellerano ................. H03L 7/07
327/158
9,773,742 B2    9/2017 Kamgaing et al.
(Continued)

FOREIGN PATENT DOCUMENTS

WO        2019132956 A1    7/2019

OTHER PUBLICATIONS

PCT Sep. 28, 2018 International Search Report and Written Opinion of the International Searching Authority from International Application No. PCT/US2017/068900; 10 pages.

*Primary Examiner* — Hrayr A Sayadian
(74) *Attorney, Agent, or Firm* — Akona IP

(57) ABSTRACT

Microelectronic assemblies, and related devices and methods, are disclosed herein. For example, in some embodiments, a microelectronic assembly may include a package substrate having a first surface and an opposing second surface; a transmitter/receiver logic (TRL) die coupled to the first surface of the package substrate; a plurality of antenna elements adjacent the second surface of the package substrate; and a transmitter/receiver chain (TRC) die, wherein the TRC die is embedded in the package substrate, and wherein the TRC die is electrically coupled to the RF die and at least one of the plurality of antenna elements via conductive pathways in the package substrate. In some embodiments, a microelectronic assembly may further include a double-sided TRC die. In some embodiments, a microelectronic assembly may further include a TRC die having an amplifier. In some embodiments, a microelectronic assembly may further include a TRL die having a modem and a phase shifter.

20 Claims, 16 Drawing Sheets

(56) References Cited

U.S. PATENT DOCUMENTS

| | | | |
|---|---|---|---|
| 2004/0227666 A1 | 11/2004 | Adachi et al. | |
| 2006/0290421 A1 | 12/2006 | Ichitsubo et al. | |
| 2009/0322643 A1 | 12/2009 | Choudhury | |
| 2010/0164783 A1 | 7/2010 | Choudhury et al. | |
| 2013/0052964 A1* | 2/2013 | Husted ............... | H04B 17/11 |
| | | | 455/73 |
| 2014/0159250 A1 | 6/2014 | Nickerson | |
| 2016/0020165 A1 | 1/2016 | Kamgaing et al. | |
| 2016/0149315 A1 | 5/2016 | Elsherbini et al. | |
| 2016/0301454 A1* | 10/2016 | Nayeb Nazar .... | H04L 25/03343 |
| 2017/0170544 A1 | 6/2017 | Kamgaing | |
| 2017/0179612 A1 | 6/2017 | Kamgaing et al. | |

\* cited by examiner

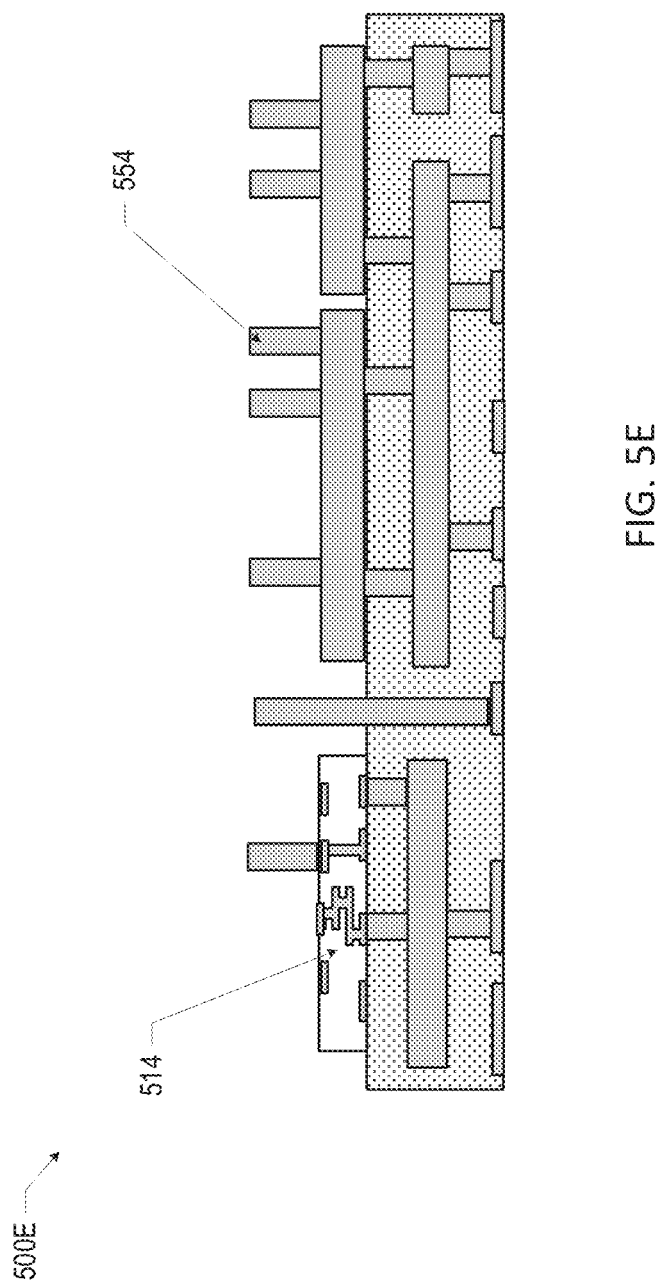

MICROELECTRONIC ASSEMBLIES

CROSS-REFERENCE TO RELATED APPLICATION

This application is a national stage application under 35 U.S.C. § 371 of PCT International Application Serial No. PCT/US2017/068900, filed Dec. 29, 2017 and entitled "MICROELECTRONIC ASSEMBLIES," which is hereby incorporated by reference herein in its entirety.

BACKGROUND

Integrated circuit devices may include a radio frequency die and integrated antennas on a package substrate for the transfer of data. The range and rate of data transfer achievable by conventional substrates by radio frequency is constrained by manufacturing and RF die placement, among other considerations.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 5A-5G are side, cross-sectional views of various stages in an example process for manufacturing a microelectronic assembly, in accordance with various embodiments.

DETAILED DESCRIPTION

Figure 1:
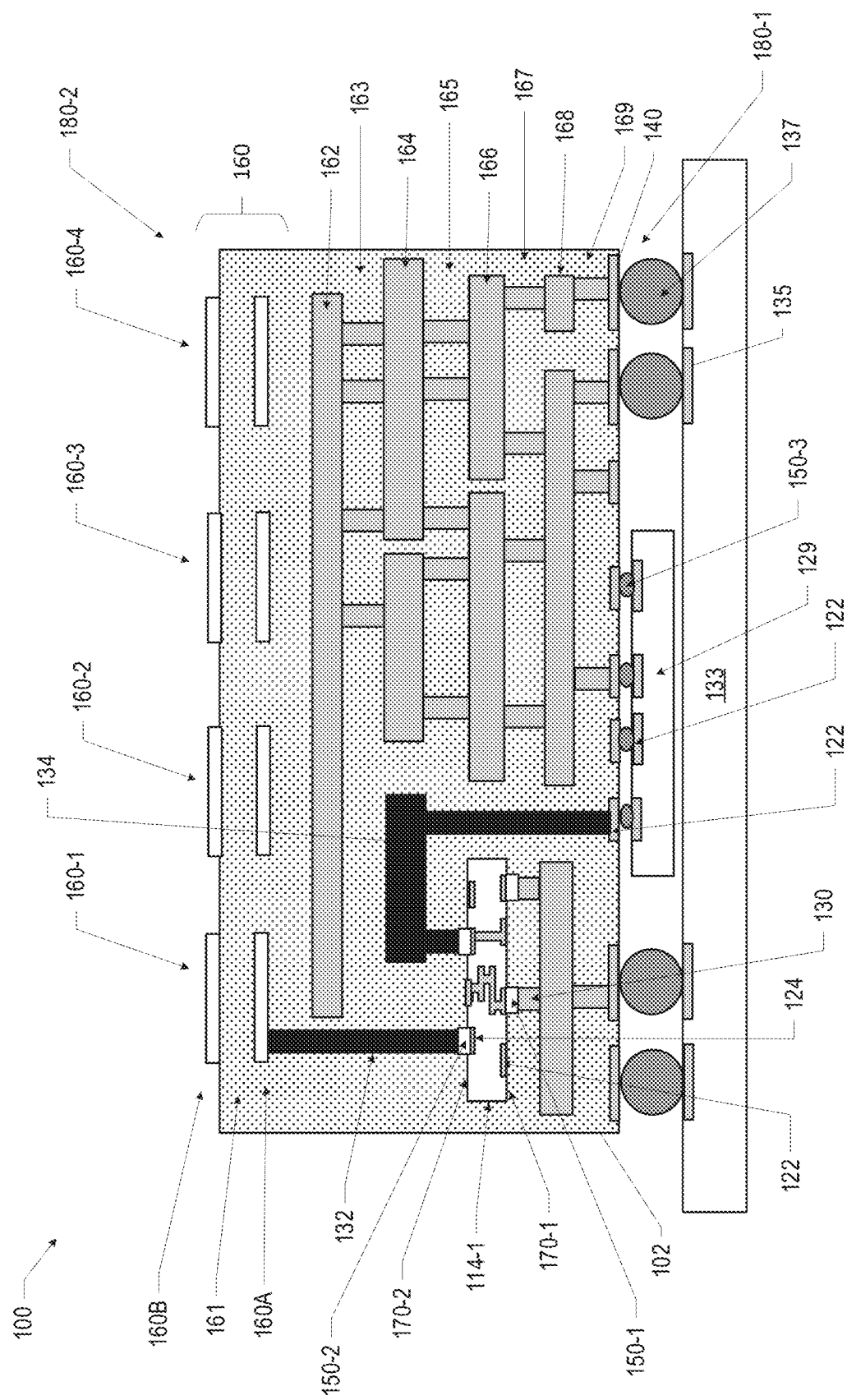
FIG. 1 is a side, cross-sectional view of an example microelectronic assembly, in accordance with various embodiments.

Microelectronic assemblies, and related devices and methods, are disclosed herein. For example, in some embodiments, a microelectronic assembly may include a package substrate having a first surface and an opposing second surface; a transmitter/receiver logic (TRL) die coupled to the first surface of the package substrate; a plurality of antenna elements adjacent the second surface of the package substrate; and a transmitter/receiver chain (TRC) die, wherein the TRC die is embedded in the package substrate, and wherein the TRC die is electrically coupled to the RF die and at least one of the plurality of antenna elements via conductive pathways in the package substrate. In some embodiments, a microelectronic assembly may further include a double-sided TRC die. In some embodiments, a microelectronic assembly may further include a TRC die having an amplifier.

In some embodiments, a microelectronic assembly may include a package substrate having a first surface and an opposing second surface; a TRL die coupled to the first surface of the package substrate; a plurality of antenna elements adjacent the second surface of the package substrate; a TRC die having a first surface with first conductive contacts and an opposing second surface with second conductive contacts, wherein the TRC die is embedded in the package substrate, and wherein the first conductive contacts are electrically coupled to the TRL die and the second conductive contacts are electrically coupled to at least one of the plurality of antenna elements via conductive pathways in the package substrate.

Integration of high performance wireless radios, such as millimeter wave (mm-wave) radios, on integrated circuit (IC) packages is challenging due to the increasingly small size of IC packages, thermal constraints, and power delivery constraints, among others. Such radios may be used for wireless docking applications, post silicon validation, rapid synchronization and downloading as well as wireless transmission of uncompressed high definition (HD) video. Common architectures for integrated antenna arrays include placing a single radio frequency (RF) die, or multiple dies that combine to contain all the logic and transmit receive chain of a single RF die, on the bottom surface of the package substrate, placing a single RF die on the top surface of the package substrate along with the antenna array, or embedding a single RF die in the package substrate. Each of these architectures present challenges to performance. By placing a single RF die on the bottom surface of the package substrate, the total area (i.e., XY dimensions, which is defined by the area of length times width) of the IC package may be minimized but the distance between the RF die and the antennas may be increased, which increases the length of the routing lines. On the transmission side, high power may be sent through the routing lines, and a high percentage of the power may be lost due to the relatively long length of the routing lines. For example, for a small array (e.g., between 4 and 8 antennas) at millimeter wave, the routing line losses may range from 1-2 decibels (dB), which corresponds to 10-20% of a power loss in the routing to the antennas. On the receiving side, the received weak signals at the antennas are routed through the longer routing lines, which may cause further attenuation in the signal. Even though the signal may be further weakened, the noise level does not weaken and remains the same. As a result, receiver sensitivity may be reduced, and the communication range may be shortened. For example, for the above small array at millimeter wave, the 1-2 dB power loss results in a 1-2 dB increase in signal noise and a 10-25% reduction in communication range. Further, a single RF die produces relatively high heat, which may require high cost thermal solutions and may limit die performance. The other conventional approaches, such as placing multiple dies on the bottom surface of the package substrate and placing a single RF die on the top surface of the package substrate, may increase the XY and z-height (i.e., thickness) dimensions of the IC package. Embedding a single RF die in a package substrate is likely to require high cost thermal solutions and is likely to limit die performance. IC packages, also referred to herein as microelectronic packages, with integrated antennas having reduced power loss, increased communication range, and increased sensitivity may be desirable.

Various ones of the embodiments disclosed herein may help achieve better wireless transmission and reception of information by having a double-sided TRC die (i.e., a TRC die having first interconnects on a first surface and second interconnects on an opposing second surface, also referred to herein as a multi-strata transistor) embedded within an IC package substrate that includes an integrated antenna. Various ones of the microelectronic assemblies disclosed herein may exhibit increased communication range, reduced power loss, and reduced signal noise while minimizing the size of the package relative to conventional approaches. The microelectronic assemblies disclosed herein may be particularly advantageous for small and low-profile applications in computers, tablets, industrial robots, and consumer electronics (e.g., wearable devices) that include wireless communications.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous, as are a "die" and an "IC die." The terms "top" and "bottom" may be used herein to explain various features of the drawings, but these terms are simply for ease of discussion, and do not imply a desired or required orientation. As used herein, the term "insulating" may mean "electrically insulating," unless otherwise specified.

When used to describe a range of dimensions, the phrase "between X and Y" represents a range that includes X and Y. For convenience, the phrase "FIG. 4" may be used to refer to the collection of drawings of FIGS. 4A-4B, the phrase "FIG. 5" may be used to refer to the collection of drawings of FIGS. 5A-5G, etc. although certain elements may be referred to in the singular herein, such elements may include multiple sub-elements. For example, "an insulating material" may include one or more insulating materials. As used herein, a "conductive contact" may refer to a portion of conductive material (e.g., metal) serving as an electrical interface between different components; conductive contacts may be recessed in, flush with, or extending away from a surface of a component, and may take any suitable form (e.g., a conductive pad or socket, or portion of a conductive line or via).

FIG. 1 is a side, cross-sectional view of a microelectronic assembly 100, in accordance with various embodiments. The microelectronic assembly 100 may include a package substrate 102 having a bottom surface 180-1 and an opposing top surface 180-2, a TRL die 129 coupled to the bottom surface 180-1 of the package substrate 102, a TRC die 114-1 embedded in the package substrate 102, and a plurality of antenna elements 160 adjacent the top surface of the package substrate 180-2. In particular, the microelectronic assembly 100 may include a package substrate 102 having a double-sided TRC die 114-1 embedded in a conductive layer 166. The top surface of die 114-1 may include a set of conductive contacts 124 and the bottom surface of die 114-1 may include a set of conductive contacts 122. The conductive contacts 122 at the bottom surface 170-1 of the die 114-1 may be electrically coupled to conductive pathways 130 within the package substrate via interconnects 150-1, and the conductive contacts 124 on the top surface 170-2 of the die 114-1 may be electrically coupled to conductive pathways 132 within the package substrate via interconnects 150-2.

As described in detail below with reference to FIG. 4, the TRL die 129 and the TRC die 114-1 may have architectures that enable the two dies to function as a single conventional RF transceiver die, where each die may include some components of a conventional RF transceiver die. For example, the TRL die 129 may include logic circuits for converting transmitted and received signals (e.g., from analog to digital and from digital to analog), a power splitter and a power combiner, and the TRC die 114-1 may include a transmitter/receiver chain with phase shifters. In some embodiments, the TRL die 129 may include a modem, logic circuits, a power splitter, a power combiner, and a phase shifter, and the TRC die 114-1 may include an amplifier. In some embodiments, the TRL die 129 may further include an amplifier, and the TRC die 114-1 may further include a phase shifter.

In some embodiments, the TRC die 114-1 is a double-sided die. In some embodiments, the TRC die 114-1 may have a thickness that is approximately equal to a thickness of the conductive layer 166 in which the TRC die 114-1 is embedded. For example, the conductive layer 166 may be patterned to include a cavity for embedding the TRC die 114-1, and the conductive layer thickness (and cavity depth) may be formed to match the thickness of the TRC die 114-1. In some embodiments, the conductive layer 166 may have a thickness between 5 microns (um) and 100 um. In some embodiments, the conductive layer 166 may have a thickness between 10 um and 50 um. In some embodiments, the conductive layer 166 may have a thickness between 25 um and 50 um. In some embodiments, the TRC die 114-1 may have a thickness between 5 um and 50 um. In some embodiments, the TRC die 114-1 is an ultra-thin die.

In some embodiments, an embedded die 114-1 may include conductive pathways to route power, ground, and/or signals to/from the die. In some embodiments, the dies may include conductive pathways to route power, ground, and/or signals between different ones of the dies on the top (not shown) and/or bottom surface of the package substrate 102, such as die 129. In some embodiments, the die 114-1 may be the source and/or destination of signals communicated between the die and other dies included in the microelectronic assembly. In some embodiments, the die 114-1 may couple directly to power and/or ground lines in the package substrate 102. By allowing the die to couple directly to power and/or ground lines in the package substrate 102, such power and/or ground lines need not be routed through the die, allowing the die to be made smaller or to include more active circuitry or signal pathways.

In some embodiments, the die 114-1 may include active or passive circuitry (e.g., transistors, diodes, resistors, inductors, and capacitors, among others). In some embodiments, the die 114-1 may include one or more device layers including transistors (e.g., as discussed below with reference to FIG. 8). When the die includes active circuitry, power and/or ground signals may be routed through the package substrate 102 and to the die through the conductive contacts on the top or bottom surface of the die. For example, die 114-1 may be coupled to a power plane or power source via conductive contacts 122, interconnects 150-1, and conductive pathways 130.

The dies 114-1 and 129 disclosed herein may include a semiconducting material such as silicon, germanium, or III-V materials such as Gallium Arsenide or Gallium Nitride. The semiconducting materials may contain active devices such as transistors, diodes etc. The dies may also include insulating material (e.g., a dielectric material formed in multiple layers, or semiconductor material, as known in the art) and multiple conductive pathways formed through the insulating material. In some embodiments, the insulating material of a die 114-1, 129 may include a dielectric material, such as bismaleimide triazine (BT) resin, polyimide materials, glass reinforced epoxy matrix materials, silicon dioxide or silicon nitride, or low-k and ultra low-k dielectric (e.g., carbon-doped dielectrics, fluorine-doped dielectrics, porous dielectrics, and organic polymeric dielectrics). In some embodiments, the insulating material of die 114-1, 129 may be a semiconductor material, such as silicon, germanium, or a III-V material. In some embodiments, the die 114-1, 129 may include silicon. The conductive pathways in die 114-1, 129 may include conductive traces and/or conductive vias, and may connect any of the conductive contacts in the die 114-1 and any suitable manner (e.g., connecting multiple conductive contacts on a same surface or on different surfaces of the die 114-1). Example structures that may be included in die 114-1, 129 disclosed herein are discussed below with reference to FIG. 8. The conductive pathways in the die 114-1, 129 may be bordered by liner materials, such as adhesion liners and/or barrier liners, as suitable.

As shown in FIG. 1, the package substrate 102 may include conductive layers (e.g., 162, 164, 166, 168) that alternate with dielectric layers (e.g., 163, 165, 167, 169). In some embodiments, the package substrate 102 may include one or more conductive layers, also referred to herein as conductive trace layer, to route power, ground, and/or signals between the different components of the package substrate 102. A conductive layer may include a single layer or may include multiple layers, for example, a conductive layer may include a seed layer and a patterned trace layer. In some embodiments, a conductive layer may include a conductive plane. The package substrate 102 may include an insulating material (e.g., e.g., a dielectric material formed in multiple layers, as known in the art) and one or more conductive pathways through the dielectric material (e.g., including conductive traces and/or conductive vias, as shown). A dielectric layer may include a single layer or may include multiple layers. In some embodiments, the insulating material of the package substrate 102 may be a dielectric material, such as an organic dielectric material, a fire retardant grade 4 material (FR-4), BT resin, polyimide materials, glass reinforced epoxy matrix materials, or low-k and ultra low-k dielectric (e.g., carbon-doped dielectrics, fluorine-doped dielectrics, porous dielectrics, and organic polymeric dielectrics). The conductive pathways in the package substrate 102 may be bordered by liner materials, such as adhesion liners and/or barrier liners, as suitable.

In some embodiments, the package substrate may include a RF routing layer 164 for routing RF signals between the TRL die 129, the TRC die 114-1, and the antenna elements 160. In some embodiments, the package substrate 102 may include conductive trace layers 162 and 166 a having a ground plane such that a ground plane may be on either side of the RF routing layer 164. The ground planes in conductive trace layers 162 and 166 may be used as shielding to reduce high frequency noise from the RF routing layer 164. Dielectric layers 163, 165 may separate the ground planes in conductive trace layers 162, 166 from the RF routing layer 164. In some embodiments, the package substrate 102 may include only a single ground plane in either conductive trace layer 162 or 166, or the ground plane may be part of the RF routing layer 164. In some embodiments, the RF routing may be part of the one or more conductive trace layers 162, 166, 168. The RF routing layer 164 may be formed using any suitable process, including the process described with reference to FIG. 5, and may be made of any suitable conductive material, such as copper, silver, nickel, gold, aluminum, or other metals or alloys. In some embodiments, the RF routing layer and the conductive trace layer are formed from the same material.

In some embodiments, one or more of the conductive pathways 132 in the package substrate 102 may extend between an antenna element 160 at the top surface 180-2 of the package substrate 102 and a conductive contact 124 at the top surface of the embedded die 114-1. In some embodiments, one or more of the conductive pathways 130 in the package substrate 102 may extend between a conductive contact 122 at the bottom of the embedded die 114-1 and a conductive contact 140 at the bottom surface of the package substrate 102. In some embodiments, one or more of the conductive pathways 132 in the package substrate 102 may extend between a conductive contact 124 at the top of the embedded die 114-1 and an antenna element 160 at the top surface of the package substrate 102. In some embodiments, one or more of the conductive pathways in the package substrate may extend between different antenna elements 160 at the top surface of the package substrate and conductive contacts on the surface of the TRL die 129 via the embedded die 114-1. In some embodiments, one or more of the conductive pathways in the package substrate 102 may extend between different conductive contacts 140 at the bottom surface of the package substrate 102, and may extend between different conductive contacts 140 via the embedded die 114-1.

Although FIG. 1 illustrates a specific number and arrangement of conductive pathways in the package of 102 and/or die 114-1, these are simply illustrative, and any suitable number and arrangement may be used. The conductive pathways disclosed herein (e.g., conductive traces and/or conductive vias) may be formed of any appropriate conductive material, such as copper, silver, nickel, gold, aluminum, or other metals or alloys, for example. The conductive pathways may have any suitable dimensions. For example, in some embodiments, the conductive pathways 134 electrically coupling the TRL die to the TRC die may have a thickness between 1 um and 100 um. In some embodiments, the conductive pathways 134 electrically coupling the TRL die to the TRC die may have a thickness between 10 um and 40 um. In some embodiments, the conductive pathways 130, 132, 134 have a same thickness. In some embodiments, the conductive pathways 130, 132, 134 have a different thickness.

In some embodiments, the package substrate 102 may be a lower density medium and the die 114-1 may be a higher density medium. As used herein, the term "lower density" and "higher density" are relative terms indicating that the conductive pathways (e.g., including conductive lines and conductive vias) in a lower density medium are larger and/or have a greater pitch than the conductive pathways in a higher density medium. For example, in some embodiments, a higher density medium (e.g., the die 114-1) may have a line or space pitch of approximately 10 microns, while a lower density medium (e.g., the package substrate 102) may have a line or space pitch of approximately 40-50 microns. In some embodiments, a higher density medium may have a line or space pitch of less than 20 microns, while a lower density medium may have a line or space pitch greater than 40 microns. In some embodiments, a higher density medium may have a line or space pitch less than 100 microns, while a lower density medium may have a line or space pitch greater than 100 microns (e.g., greater than 200 microns). In some embodiments, a higher density medium may be manufactured using a modified semi-additive process or a semi-additive build-up process with advanced lithography (with small vertical interconnect features formed by advanced laser or lithography processes), while a lower density medium may be a printed circuit board (PCB) manufactured using a standard PCB process (e.g., a standard subtractive process using etch chemistry to remove areas of unwanted copper, and with coarse vertical interconnect features formed by a standard laser process).

FIG. 1 depicts the plurality of antenna elements 160, adjacent the top surface 180-2 of the package substrate 102, as four antenna elements, which are arranged in first layer 160A and second layer 160B and in vertical pairs 160-1, 160-2, 160-3, and 160-4. In some embodiments, the plurality of antenna elements 160 may be arranged in an array. In some embodiments, plurality of antenna elements 160 may include components of a single-layer antenna (not shown). In some embodiments, plurality of antenna elements 160 may include components of a multi-layer antenna. The multi-layer antenna may have broader frequency bandwidth relative to a single-layer antenna. The multi-layer antenna may be implemented on one, two, or more layers of the package substrate. For example, the multi-layer antenna as shown in FIG. 1 includes a first layer of antenna elements 160A and a second layer of antenna elements 160B, wherein the first layer 160A and second layer of antenna elements 160B are separated by a dielectric layer 161. In some embodiments, the multi-layer antenna may have the first layer of antenna elements coupled to the second layer of antenna elements via conductive pathways (not shown). In some embodiments, the multi-layer antenna may include a capacitively coupled antenna where the first layer of antenna elements 160A is capacitively coupled to the second layer of antenna elements 160B and not galvanically coupled via conductive pathways. When capacitively coupled, signals transmitted from the first layer of antenna elements 160A may excite the second layer of antenna elements 160B into transmission as well. In some embodiments, the capacitively coupled antenna elements may be vertically aligned. In some embodiments, the plurality of antenna elements 160 may include a stacked patch antenna, a slot antenna, a dipole antenna, a monopole antenna, a spiral antenna, a tapered slot antenna, or any other antenna type that meets the design bandwidth and performance requirements.

In some embodiments, the microelectronic assembly 100 may include one or more solder mask layers formed on an outermost top surface 180-2 of the package substrate 102 (not shown). The one or more solder mask layers may have openings to allow formation of electrical connections (e.g., solder bumps, pillars, or balls). The one or more solder mask layers may have any suitable thicknesses and/or may be composed of any suitable material or combination of materials. For example, each solder mask layer may have a thickness of about 15 microns to 40 microns, and may be made of a solder resist material. In some embodiments, a cover film may be formed over the top surface of the antenna elements (e.g., the second layer of antenna elements 160B). In some embodiments, the cover film may be deposited before the solder mask layer. In some embodiments, the cover film may be a millimeter wave material.

The microelectronic assembly of FIG. 1 may also include a circuit board 133. The package substrate 102 may be coupled to the circuit board 133 by second level interconnects 137 at the bottom surface of the package substrate 108-1. In particular, the package substrate 102 may include conductive contacts 140 at its bottom surface, and the circuit board 133 may include conductive contacts 135 at its top surface; the second level interconnects 137 may electrically and mechanically couple the conductive contacts 135 and the conductive contacts 140. The second level interconnects 137 illustrated in FIG. 1 are solder balls (e.g., for a ball grid array arrangement), but any suitable second level interconnects 137 may be used (e.g., pins in a pin grid array arrangement or lands in a land grid array arrangement). The circuit board 133 may be a motherboard, for example, and may have other components attached to it (not shown). The circuit board 133 may include conductive pathways and other conductive contacts (not shown) for routing power, ground, and signals through the circuit board 133, as known in the art. In some embodiments, the second level interconnects 137 may not couple the package substrate 102 to a circuit board 133, but may instead couple the package substrate 102 to another IC package, an interposer, or any other suitable component.

Any of the conductive contacts disclosed herein (e.g., conductive contacts 122, 124, and/or 150) may take any suitable form. In some embodiments, the conductive contacts may include padless traces and/or padless vias, or any other suitable thin stand-off height techniques, such as, for example, an anisotropic conductive material (e.g., anisotropic conductive film (ACF)), die attach film (DAF), ultra-small stand-off height solder with non-conductive film (NCF), and metal-to-metal interconnects, among others. In some metal-to-metal interconnects that utilize hybrid bonding, a dielectric material (e.g., silicon oxide, silicon nitride, or silicon carbide) may be present between the metals bonded together (e.g., between copper pads or posts that provide the associated conductive contacts 124). Same metal-to-metal interconnects may be capable of reliably conducting a higher current than other types of interconnects; for example, some solder interconnects may form brittle intermetallic compounds over time with electric currents flowing through the contact, and the maximum current provided through such interconnects may be constrained to mitigate mechanical failure. In some embodiments, the die-to-package-substrate (DTPS) surface interconnects 150-3 disclosed herein may include solder (e.g., solder bumps or balls that are subject to a thermal reflow to form the DTPS interconnects 150-3). DTPS interconnects 150-3 that include solder may include any appropriate solder material, such as lead/tin, tin/bismuth, eutectic tin/silver, ternary tin/silver/copper, eutectic tin/copper, or other alloys. In some embodiments, the DTPS interconnects 150-3 may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

A number of elements are illustrated in FIG. 1 as included in the microelectronic assembly, but a number of these elements may not be present in a microelectronic assembly. For example, in various embodiments, the interconnects 150, the second level interconnects 137, and/or the circuit board 133 may not be included. Further, FIG. 1 illustrates a number of elements that are omitted from subsequent drawings for ease of illustration, but may be included in any of the microelectronic assemblies disclosed herein. Examples of such elements include the interconnects 150, the second level interconnects 137, and/or the circuit board 133. Many of the elements of the microelectronic assembly 100 of FIG. 1 are included in other ones of the accompanying figures; the discussion of these elements is not repeated when discussing these figures, and any of these elements may take any of the forms disclosed herein. A number of elements are not illustrated in FIG. 1, but may be present in microelectronic assemblies disclosed herein, for example, additional active components, such as dies, or additional passive components, such as surface-mount resistors, capacitors, and/or inductors, may be disposed on the top surface or the bottom surface of the package substrate 102, or embedded in the package substrate 102, and may be electrically connected to an embedded die 114-1.

The elements of the microelectronic assembly 100 may have any suitable dimensions. For example, in some embodiments, a thickness of the package substrate 102 may be between 0.25 millimeters and 3 millimeters (e.g., between 0.25 millimeters and 2 millimeters, between 0.4 millimeters and 0.6 millimeters, or approximately 0.5 millimeters).

Although FIG. 1 depicts a single TRC die 114-1, the microelectronic assemblies disclosed herein may have any suitable number of embedded TRC dies 114. In particular, the number of embedded TRC dies 114 may depend on the number of antenna elements. In some embodiments, the number of TRC dies equals the number of antenna elements. In some embodiments, two or more antenna elements may share one embedded TRC die 114, such that the number of antenna elements is greater than the number of TRC dies. In some embodiments, one antenna element may be coupled to two TRC dies, such that the number of dies 114 is greater than the number of antenna elements; for example, where each die has a particular polarization associated with the polarized antenna.

Figure 2:
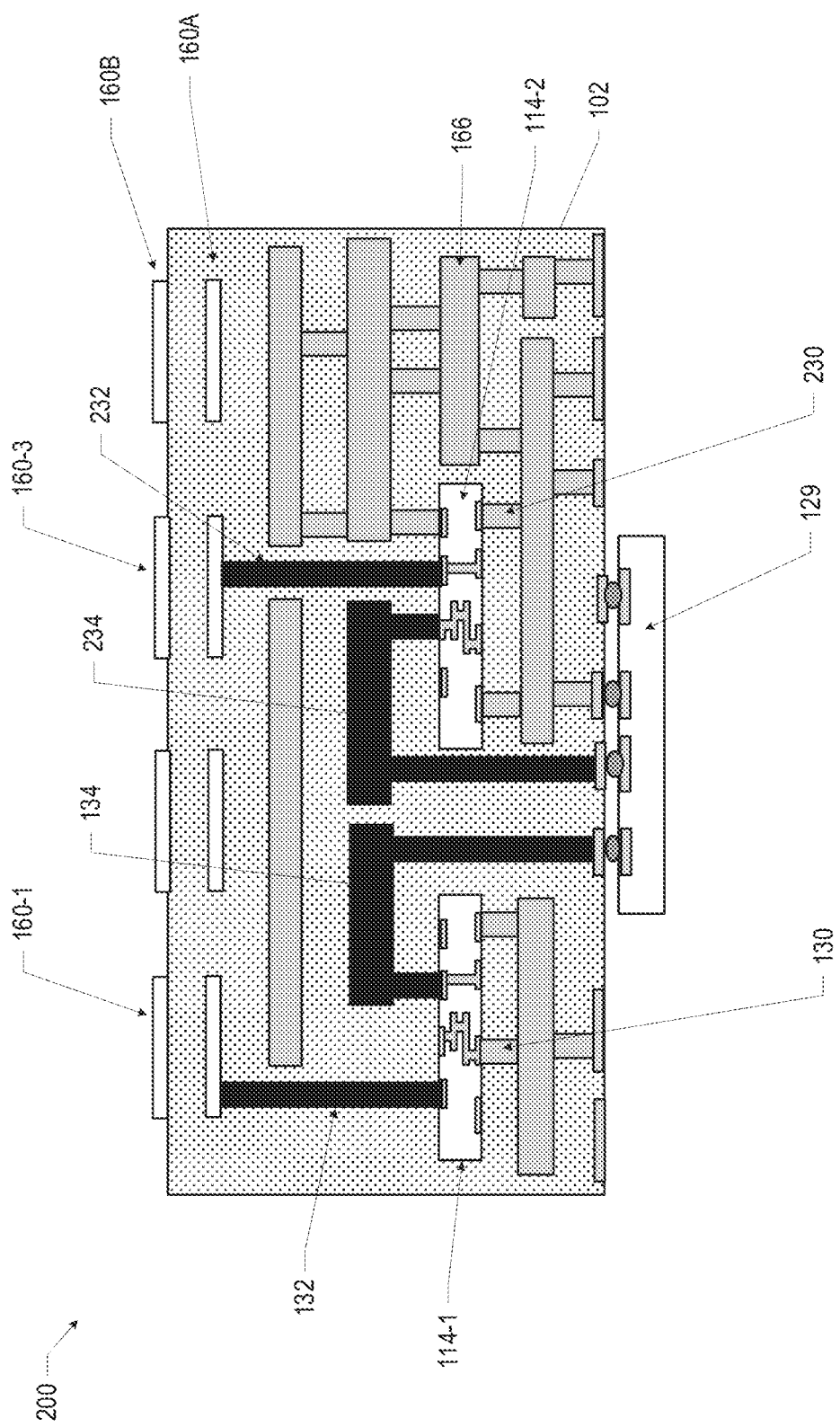
FIG. 2 is a side, cross-sectional view of another example microelectronic assembly, in accordance with various embodiments.
Figure 3:
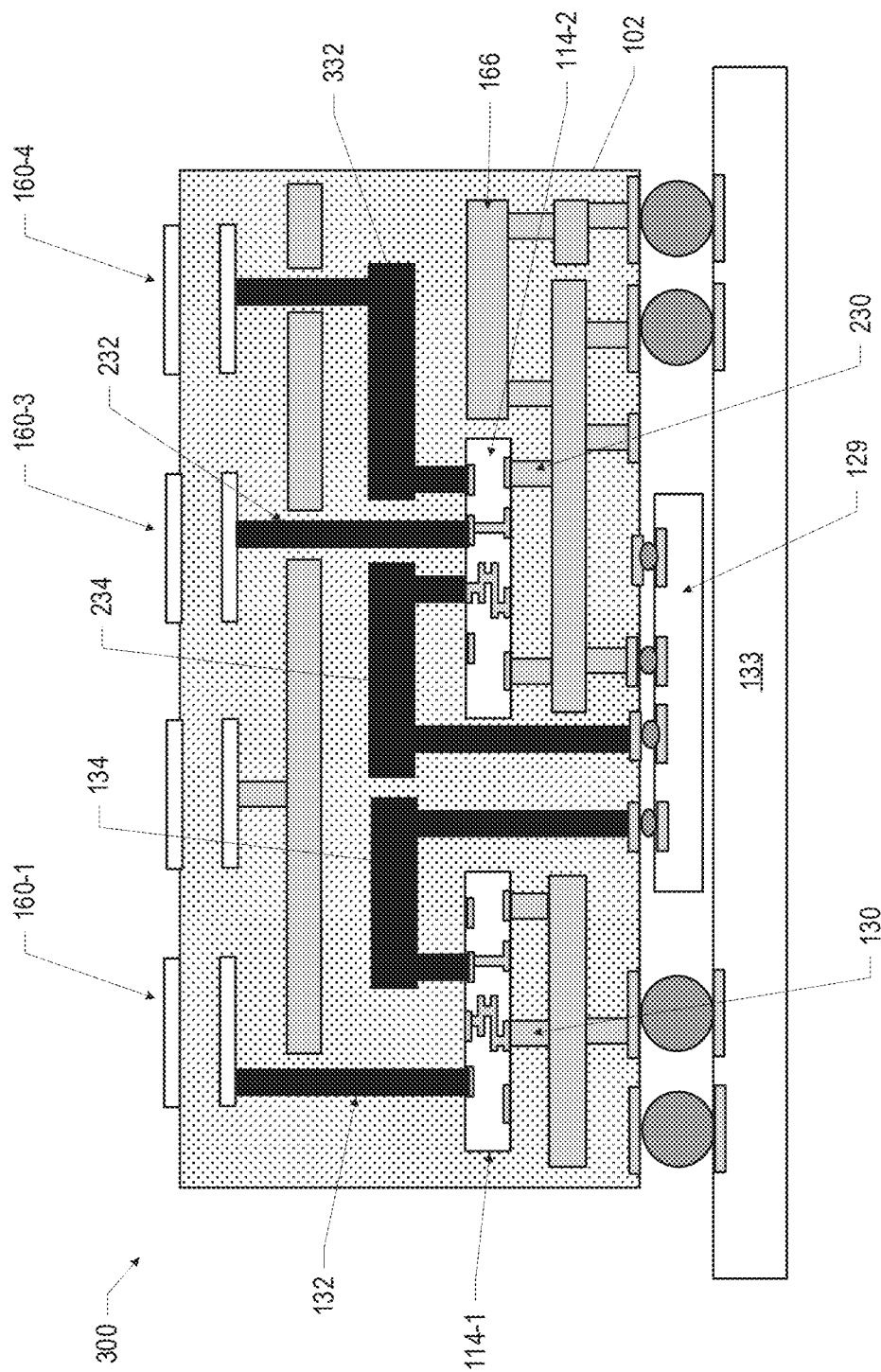
FIG. 3 is a side, cross-sectional view of another example microelectronic assembly, in accordance with various embodiments.

FIGS. 2 and 3 depict microelectronic assemblies having multiple embedded TRC dies. FIG. 2 is a side, cross-sectional view of another example microelectronic assembly 200, in accordance with various embodiments. The microelectronic assembly 200 is the microelectronic assembly 100 further including TRC die 114-2. The microelectronic assembly 200 may include a package substrate 102 having a first TRC die 114-1 and a second TRC die 114-2 embedded in a conductive layer 166. The first TRC die 114-1 may be coupled to antenna element 160-1 via conductive pathway 132, and coupled to TRL die 129 via conductive pathway 134. The first TRC die 114-1 may be coupled to a power plane via conductive pathway 130. The second TRC die 114-2 may be coupled to antenna element 160-3 via conductive pathway 232, and coupled to TRL die 129 via conductive pathway 234. The second TRC die may be coupled to a power plane via conductive pathway 230.

FIG. 3 is a side, cross-sectional view of another example microelectronic assembly 300, in accordance with various embodiments. The microelectronic assembly 300 is the microelectronic assembly 200 coupled to two antenna elements 160-3, 160-4 and further includes conductive pathway 332. The second TRC die 114-2 also may be coupled to antenna element 160-4 via conductive pathway 332.

Although FIGS. 2 and 3 depict a microelectronic assembly having only two embedded TRC dies, a microelectronic assembly may have any suitable number of embedded TRC dies.

Figure 4A:
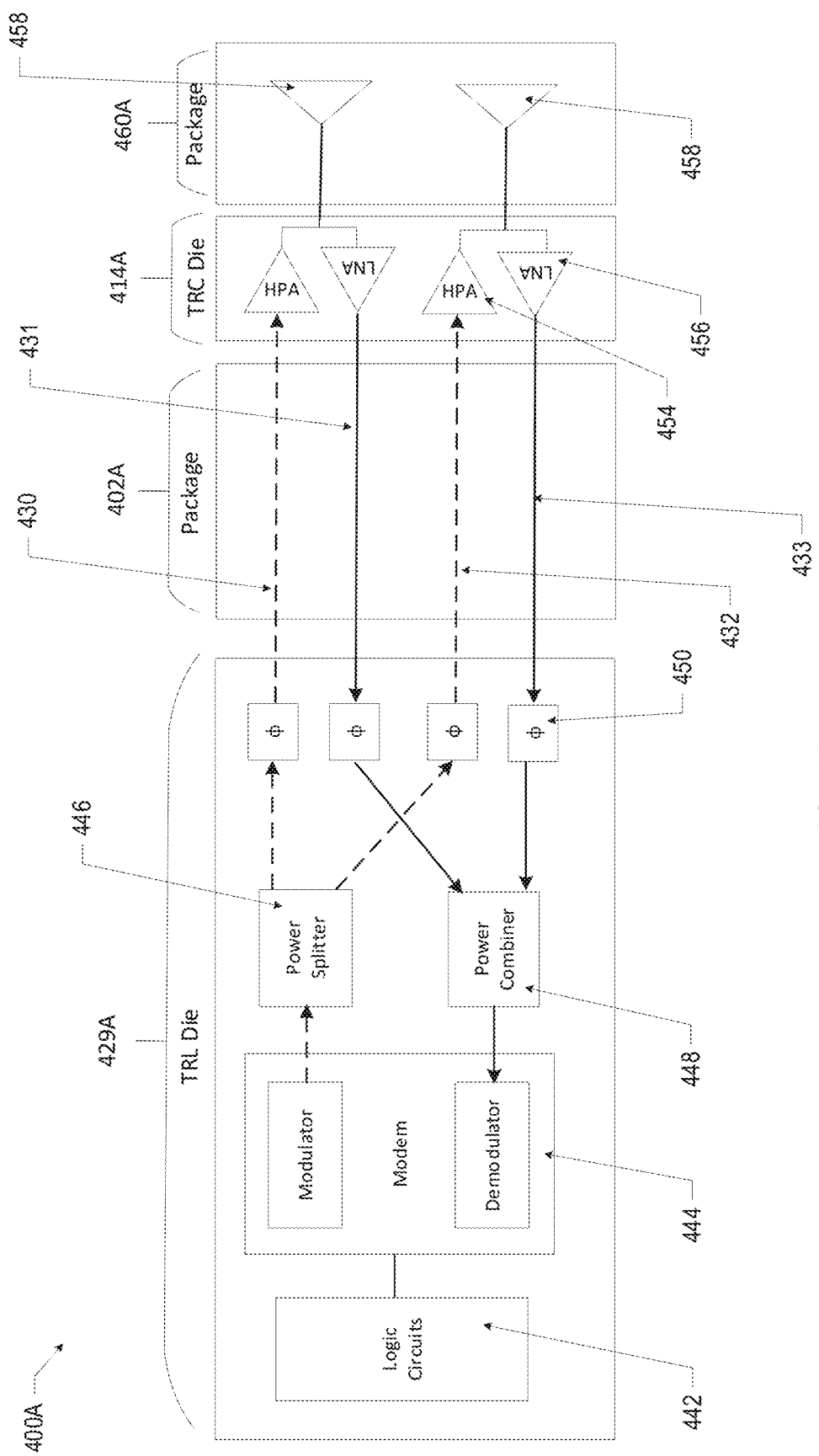
FIGS. 4A-4B are example radio frequency architectures of a microelectronic assembly, in accordance with various embodiments.
Figure 4B:
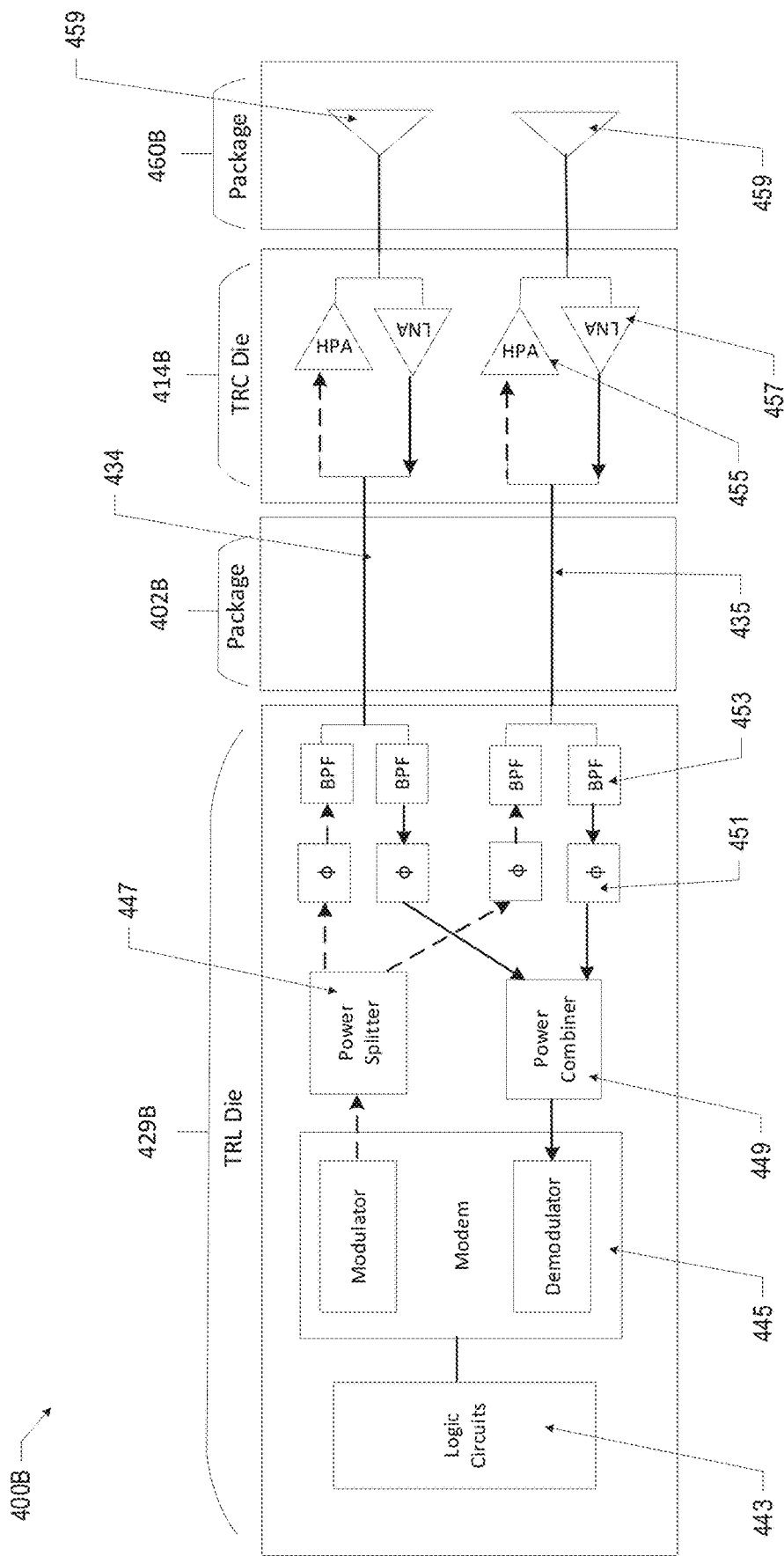

FIGS. 4A-4B are example RF architectures of a microelectronic assembly 400, in accordance with various embodiments. FIG. 4A illustrates example components of a TRL die 429A, and example components of a TRC die 414A of a microelectronic assembly 400A. Microelectronic assembly 400A may include a TRL die 429A, a TRC die 414A, embedded in package substrate 402A, and package substrate antenna elements 460A. A signal may be transmitted and received by microelectronic assembly 400A. As illustrated in FIG. 4A a signal transmission path directionality may be indicated by dotted-lined arrows and a signal reception path may be indicated by solid-lined arrows. A signal may be transmitted by the TRL die 429A through conductive pathways in package substrate 402A to TRC die 414A, and from TRC die 414A to antennas 458. A signal may be received by following a path from antennas 458 to TRC die 414A, then through conductive pathways in package substrate 402A to TRL die 429A. TRL die 429A may include logic circuits 442, a modem 444, a power splitter 446, a power combiner 448, and one or more phase shifters 450. TRL die 429A may include one or more amplifiers. The one or more amplifiers may include a high power amplifier 454 or a low noise amplifier 456. As shown in FIG. 4A, the number of routing lines 430-433 may be twice the number of antennas 458. As shown in FIG. 4A, the TRC die 414A circuitry does not enable transmitting and receiving signals at the same time.

FIG. 4B illustrates example components of a TRL die 429B, and example components of a TRC die 414B of a microelectronic assembly 400B. Microelectronic assembly 400B may include a TRL die 429B, a TRC die 414B, where the TRC die 414B is embedded in package substrate 402B, and package substrate antenna elements 460B. A signal may be transmitted and received by microelectronic assembly 400B. As illustrated in FIG. 4B a signal transmission path directionality may be indicated by dotted-lined arrows and a signal reception path may be indicated by solid-lined arrows. A signal may be transmitted by the TRL die 429B through conductive pathways in package substrate 402B to TRC die 414B, and from TRC die 414B to antennas 459. A signal may be received by following a path from antennas 459 to TRC die 414B, then through conductive pathways in package substrate 402B to TRL die 429B. TRL die 429B may include logic circuits 443, a modem 445, a power splitter 447, a power combiner 449, one or more phase shifters 451, and one or more band-pass filters (BPF) 453. A BPF is a device that passes frequencies within a certain range and rejects frequencies outside that range. TRL die 429B may include one or more amplifiers. The one or more amplifiers may include a high power amplifier 455 or a low noise amplifier 457. As shown in FIG. 4B, the number of routing lines 434-435 may be the same as the number of antennas 459. As shown in FIG. 4B, the TRC die 414B circuitry enables transmitting and receiving signals at the same time.

As shown in FIGS. 4A and 4B, two phase shifters are used per chain such that the transmission and reception directions may be independent. In some embodiments, the phase shifters may be placed after the power combiners such that the transmission and reception directions are the same. In some embodiments, TRL die 429A, 429B may include other components (not shown), such as an oscillator, an amplifier (e.g., a high power amplifier or a low noise amplifier), matching circuits, additional amplifier stages, switches, or error correction circuits. In some embodiments, TRC die 414A, 414B may include other components (not shown), such as a phase shifter, additional amplifier stages, matching circuits, filters, amplifier gain control circuitry (e.g., for variable gain amplifiers), or switches.

Any suitable techniques may be used to manufacture the microelectronic assemblies disclosed herein. For example, FIGS. 5A-5G are side, cross-sectional views of various stages in an example process for manufacturing the microelectronic assembly 100 of FIG. 1, in accordance with various embodiments. Although the operations discussed below with FIGS. 5A-5G are illustrated in a particular order, these operations may be performed in any suitable order. Additionally, although particular assemblies are illustrated in FIGS. 5A-5G (and others of the accompanying drawings representing manufacturing processes), the operations discussed below with reference to FIGS. 5A-5G may be used to form any suitable assemblies.

One of the main drivers for package design rules is the input/output (I/O) density per mm per layer (IO/mm/layer). For example, the I/O density may be limited by the via pad sizes, which may be defined by manufacturing tolerances of conventional packaging technologies. In some conventional manufacturing processes, such as laser drilling, the via pads need to be relatively large. Laser drilling is limited by the minimum feature size and the misalignment of the laser when drilling the via opening. For example, the minimum feature size of a laser drilled via opening may be approximately 40 µm or larger when a $CO_2$ laser is used, and the misalignment between the layers may be approximately +/−15 µm or larger. As such, the via pad sizes may need to be approximately 70 µm (i.e., 40+2(15) µm) or larger in some conventional technologies. Alternative laser sources, such as ultraviolet lasers, may be able to reduce the via opening more, but throughput may also be decreased. Accordingly, some embodiments disclosed herein may utilize one or more processes that form the vias with lithographic processes instead of with lasers. The use of lithographic processes allows for an improved layer-to-layer alignment and smaller pads compared to laser drilling, which in turn results in higher I/O densities. Additionally, the throughput time is deceased with lithography-based processes because all of the vias may be formed at once (i.e., a single exposure and patterning) instead of being formed sequentially when laser drilling is used.

Furthermore, the use of lithography-based processes to form the vias allows for the vias to be formed in any desire shape. Instead of being limited to the shape of the laser, a lithographically defined via may be customized for a desired purpose. For example, whereas a laser defined via may be limited to a circular shape, some embodiments may include vias that are rectangular in shape and extend in lateral direction along the routing line.

Figure 5A:
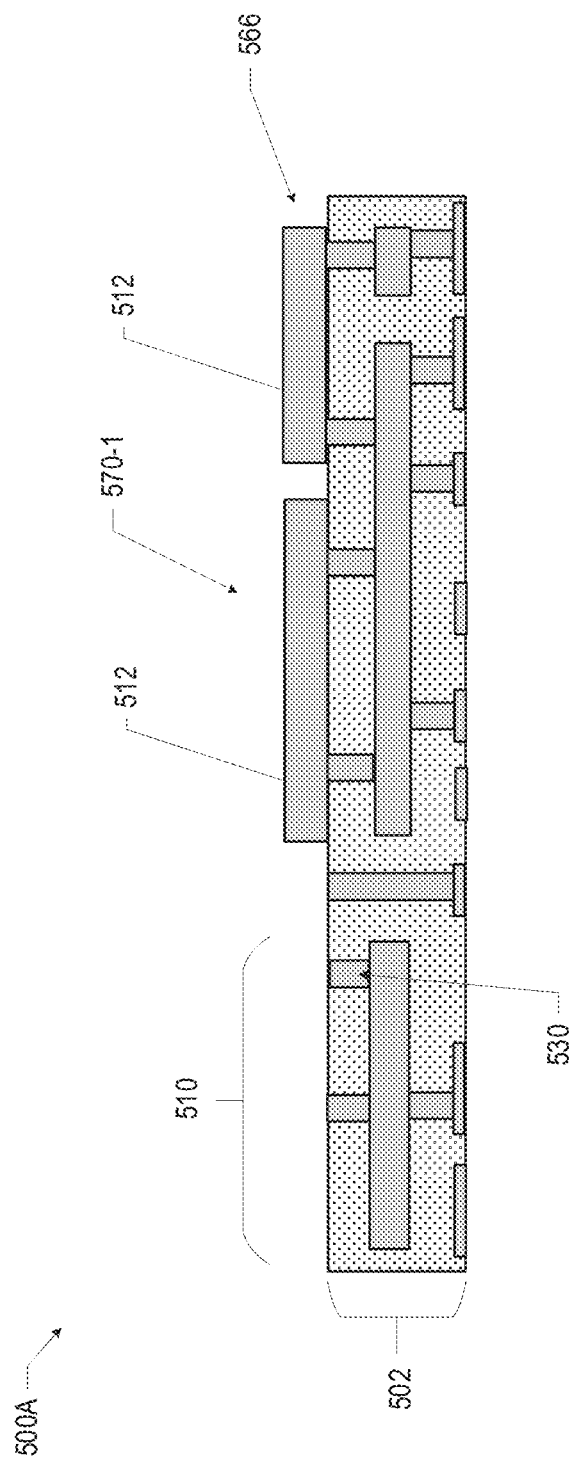

FIG. 5A illustrates an assembly 500A including a package substrate portion 502. In some embodiments, the package substrate portion 502 may be formed using a lithographically defined via packaging process. In some embodiments, the package substrate portion 502 may be manufactured using standard PCB manufacturing processes, and thus the package substrate portion 502 may take the form of a PCB, as discussed above. In some embodiments, the package substrate portion 502 may be a set of redistribution layers formed on a panel carrier (not shown) by laminating or spinning on a dielectric material, and creating conductive vias and lines by laser drilling and plating. In some embodiments, the package substrate portion 502 may be formed on a removable carrier (not shown) using any suitable technique, such as a redistribution layer technique. Any method known in the art for fabrication of the package substrate portion 502 may be used, and for the sake of brevity, such methods will not be discussed in further detail herein. The package substrate portion may be the "bottom" portion of the package substrate 102, as discussed further below, and may include conductive contacts 140 at the bottom surface of the package substrate 102 for attaching to a circuit board.

The package substrate portion 502 may be built up to a desired layer 566 for embedding the die. The package substrate portion may have padless vias 530 and other conductive features (not shown) on the top surface 570-1. In some embodiments, a metallization or conductive layer 566 may be patterned on the top surface 570-1 of the package substrate portion 502 to form a cavity 510 having the padless vias 530 or other conductive contacts (not shown) along the bottom side of the cavity (i.e., at the top surface 570-1 of the package substrate portion 502). The conductive layer 566 may be formed by depositing, exposing, and developing a photoresist layer on the top surface 570-1 of the package substrate portion 502. The photoresist layer may be patterned to form the cavity 510. Conductive material, such as copper, may be deposited in the openings in the patterned photoresist layer to form conductive features 512, such as traces, vias, and/or a conductive plane. The conductive material may be depositing using any suitable process, such as electroplating, sputtering, or electroless plating. The photoresist may be removed to expose the conductive features 512 and the formed cavity 510.

Figure 5B:
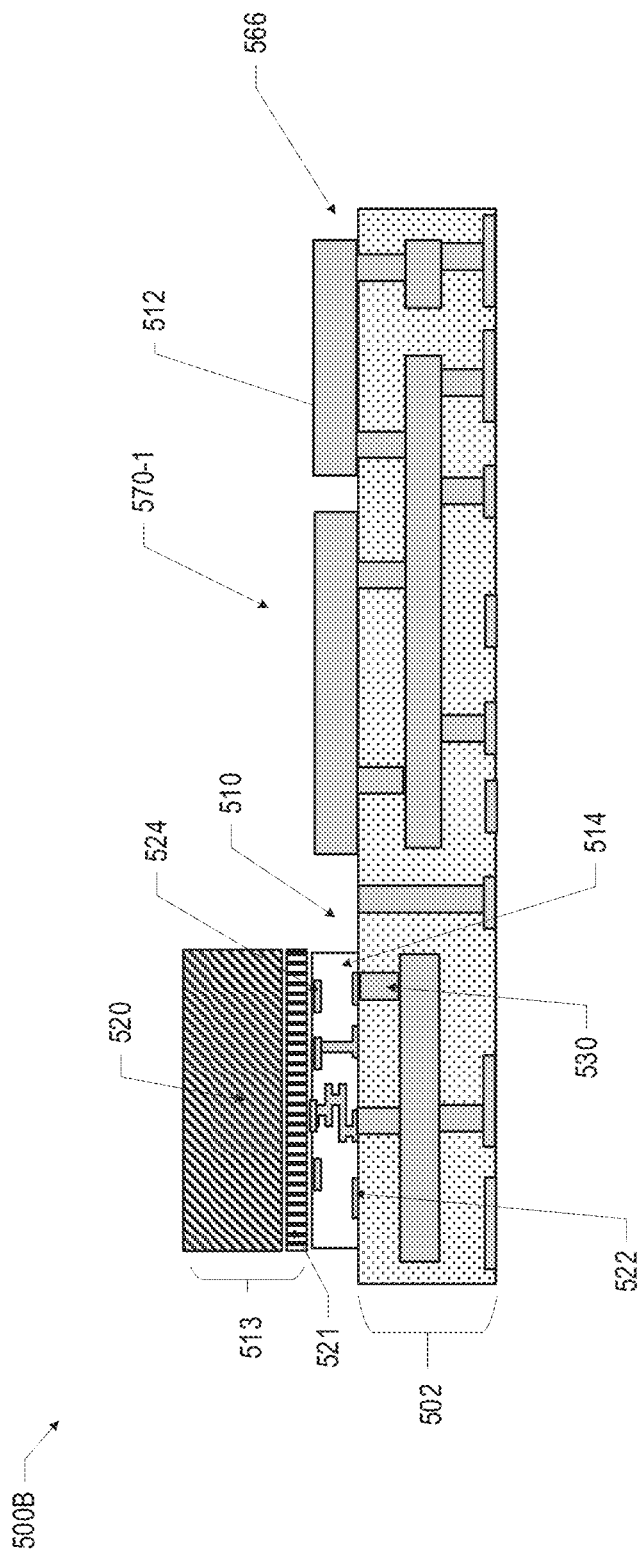

FIG. 5B illustrates an assembly 500B subsequent to positioning the die assembly 513 in the cavity 510 and coupling the die assembly 513 to the package substrate portion 502. The die assembly 513 may include a die 514 and a non-electrical material layer 520 on top of the die 514. The non-electrical carrier material layer 520, which is an inactive portion of the die assembly 513, may include silicon, ceramic, or quartz, among other materials. In some embodiments, the non-electrical material layer 520 may have a thickness of 100 um to 750 um. In some embodiments, the non-electrical material layer 520 may have a thickness of 100 um to 250 um to minimize the amount material removed as described in more detail below in reference to FIG. 5C. The non-electrical material layer 520 may be attached to the die 514 using any suitable technique, including, for example, a release layer 521. The release layer 521 (also referred to herein as a debonding layer) may include a temporary adhesive, or other material that releases when exposed to heat or light, for example. The die 514 may include any of the features discussed above with reference to the die 114. In some embodiments, for example, the die 514 may include a layer of transistors (not shown), such as silicon transistors, within an interlayer dielectric (ILD) layer, and the ILD may have multiple conductive layers that may connect conductive contacts 522 on the bottom of the die 514 to connective contacts 524 on the top of the die 514. In particular, the die assembly 513 may be arranged in the assembly 500B such that the conductive contacts 522 of the die 514 may be coupled to the padless vias 530 of the package substrate portion 502. In some embodiments, multiple cavities may be formed such that multiple dies may be embedded in a single layer as described above with reference to FIGS. 2 and 3. In some embodiments, the dies may be placed directly without a carrier depending on the assembly tools capability and active die 514 thickness.

In the embodiment of FIGS. 5A-5H, the die assembly 513 may be disposed on a carrier that provides improved mechanical stability, and then may be coupled to the package substrate portion 502. This approach may be particularly desirable for relatively small dies. The die assembly 513 may be "upside down" on the carrier, in the sense that the conductive contacts 522 on the bottom surface of the die 514 are facing away from the carrier, and the non-electrical material layer 520 is attached to the carrier. The die assembly 513 may be secured to the carrier using any suitable technique, such as a removable adhesive. In some embodiments, more than one die may be secured to the carrier and placed on the package substrate portion at the same time. The carrier may include any suitable material for providing mechanical stability during manufacturing operations.

Figure 5C:
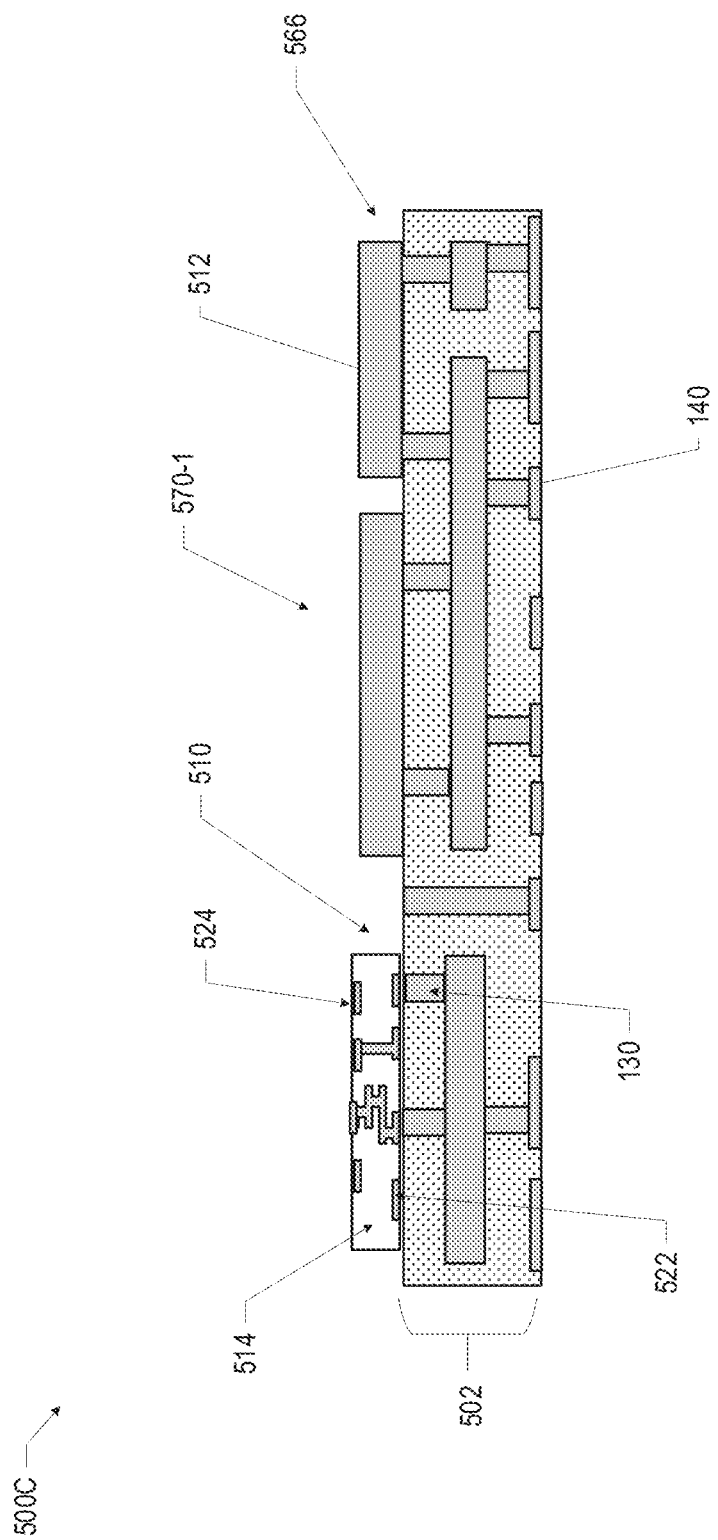

FIG. 5C illustrates an assembly 500C subsequent to removing the non-electrical material layer 520 and the debonding layer 521 from the die 514. The non-electrical material layer 520 may be removed using any suitable technique, including, for example, grinding, etching, such as reactive ion etching (RIE) or chemical etching, or, if the debonding layer includes a photo-reactive or thermally-reactive material, applying light or heat. In some embodiments, die 514 may be disposed on a carrier, before or after the non-electrical material layer is removed, that provides improved mechanical stability, and then may be coupled to the package substrate portion 502.

In the embodiment of FIGS. 5A-5H, the die assembly 513 may be coupled to the package substrate portion 502 prior to the conductive layer 566 being formed, such that the conductive layer 566 may be formed to surround the die assembly 513. The conductive layer 566 may be formed around the coupled die as described above with respect to FIG. 5A (e.g., using a lithographically defined via process) and may be formed prior to removing the non-electrical material layer 520 or may be formed after removal of the non-electrical material layer 520. In some embodiments, more than one die assembly 513 and or die 514 may be coupled to the package substrate prior to the conductive layer 566 being formed.

Figure 5D:
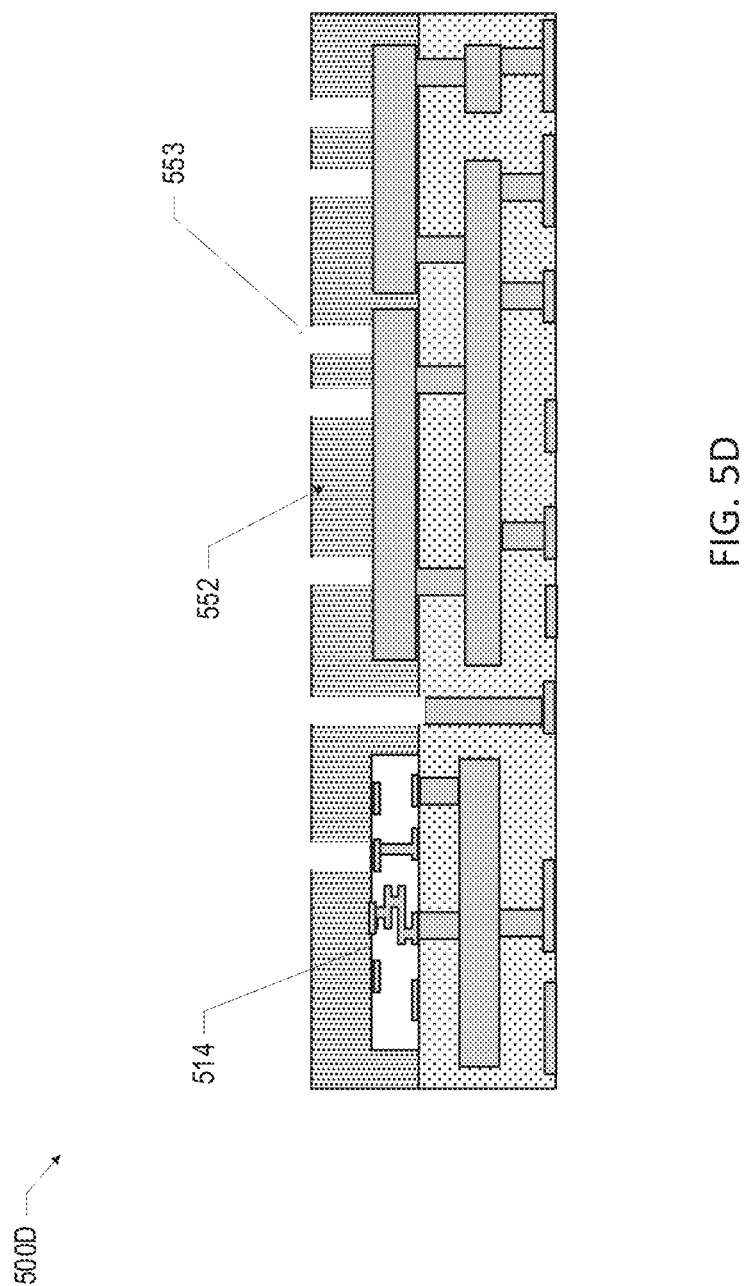

FIG. 5D illustrates an assembly 500D subsequent to depositing a photoresist material 552 and patterning the photoresist material to provide openings 553 for the formation of conductive features. The photoresist material 552 may be patterned using any suitable technique, including a lithographic process (e.g., exposing the photoresist material to a radiation source through a mask and developing with a developer). The openings 553 may have any suitable size and shape for forming a conductive structure having desired characteristics. For example, opening 553 may shaped to form a conductive via having a round cross-section.

Optionally, a seed layer (not shown) may be deposited over a top surface of the assembly 500C prior to depositing the photoresist material 552. The seed layer may be formed over the top surface to cover the top surface 570-1 of the package substrate portion 502, the conductive features 512, and the die 514. The seed layer may be any suitable conductive material, including copper. In some embodiments, the seed layer may be omitted.

FIG. 5E illustrates an assembly 500E subsequent to depositing a conductive material 554 in the openings 553 of assembly 500D and stripping the photoresist material 552 to expose the conductive structures 554. The conductive material 554 may be depositing using any suitable technique, including, for example, electroplating. Although FIG. 5E shows the conductive structures 554 as conductive vias, the conductive structures 554 may take any form, including conductive traces, or a heat spreader, among others. If a seed layer was deposited, the remaining portions of the seed layer may be removed using any suitable process, including chemical etching, among others.

Figure 5F:
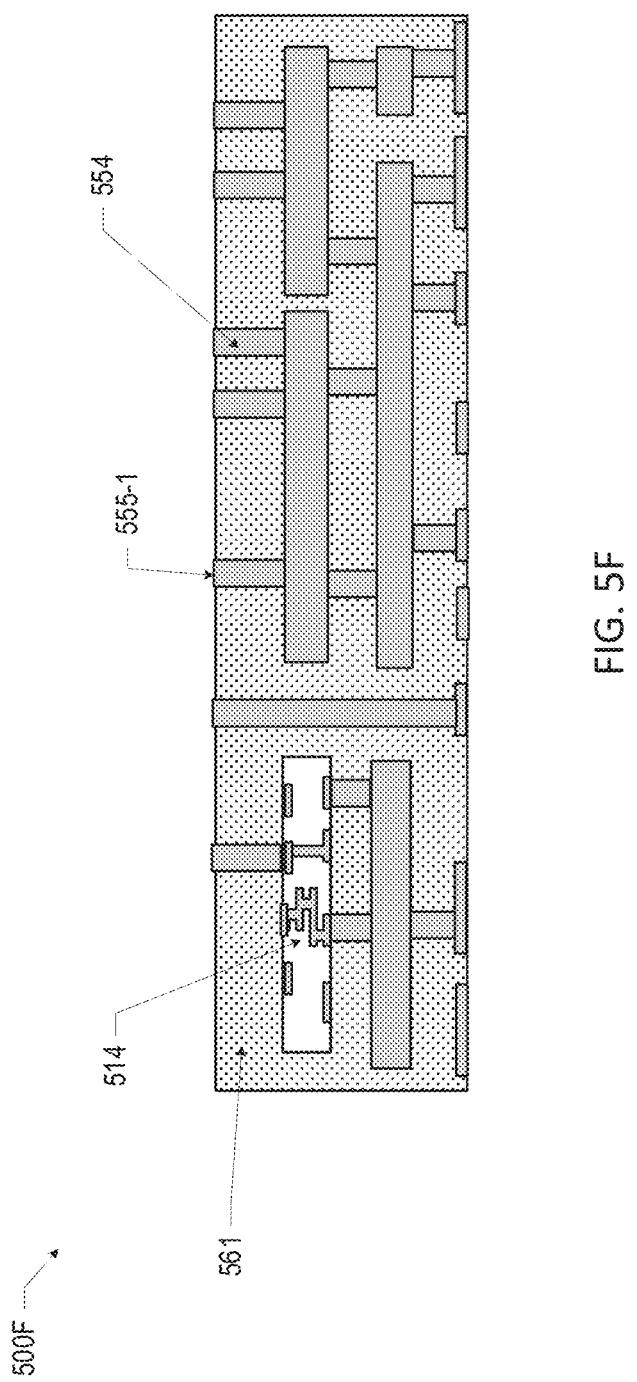

FIG. 5F illustrates an assembly 500F subsequent to forming a dielectric layer 561 over a top surface of assembly 500E and exposing the top surface 555-1 of the conductive structures 554. The dielectric layer 561 may be formed using any suitable process, including lamination, or slit coating and curing. The dielectric layer 561 may be formed to completely cover the conductive structures 554, such that the thickness of the deposited dielectric layer 561 is greater than the thickness of the conductive structures 554. The dielectric layer 561 may be removed to expose the top surface 555-1 of the conductive structures 554 using any suitable technique, including grinding, or etching, such as a wet etch, a dry etch (e.g., a plasma etch), a wet blast, or a laser ablation (e.g., using excimer laser). In some embodiments, the thickness of the dielectric layer 561 may be minimized to reduce the etching time required to expose the top surface 555-1 of the conductive structures 554.

Figure 5G:
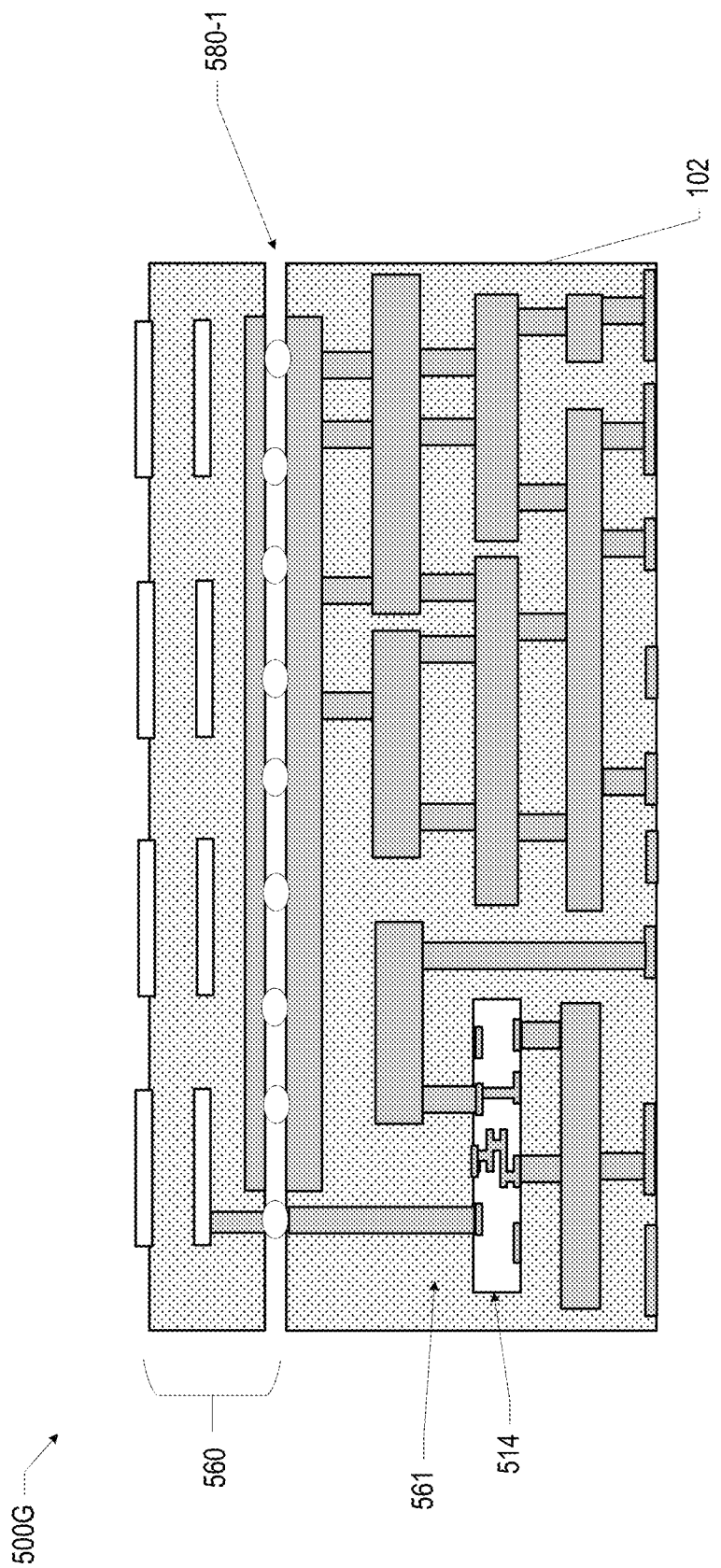

Additional layers of the package substrate may be built up by repeating the process as described with respect to FIGS. 5A-5F, for example, to form a conductive trace layer, a RF routing layer, or antenna elements. FIG. 5G illustrates assembly 500G subsequent to forming additional conductive layers and a plurality of antenna elements on the top surface 580-1 of package substrate 102. The plurality of antenna elements 560 may be formed by repeating the process as described in FIGS. 5A-5F. In some embodiments, as shown in FIG. 5G, the plurality of antenna elements may be pre-formed as a subassembly and coupled to the top surface of the package substrate by solder bumps or any other suitable process, for example, as described above with reference to conductive interconnects 150-3. The finished substrate may be a single package substrate or may be a repeating unit that may undergo a singulation process in which each unit is separated for one another to create a single package substrate. Further operations may be performed as suitable (e.g., depositing a solder resist layer, attaching additional dies to the package substrate, attaching solder balls for coupling to a circuit board, etc.).

Figure 6:
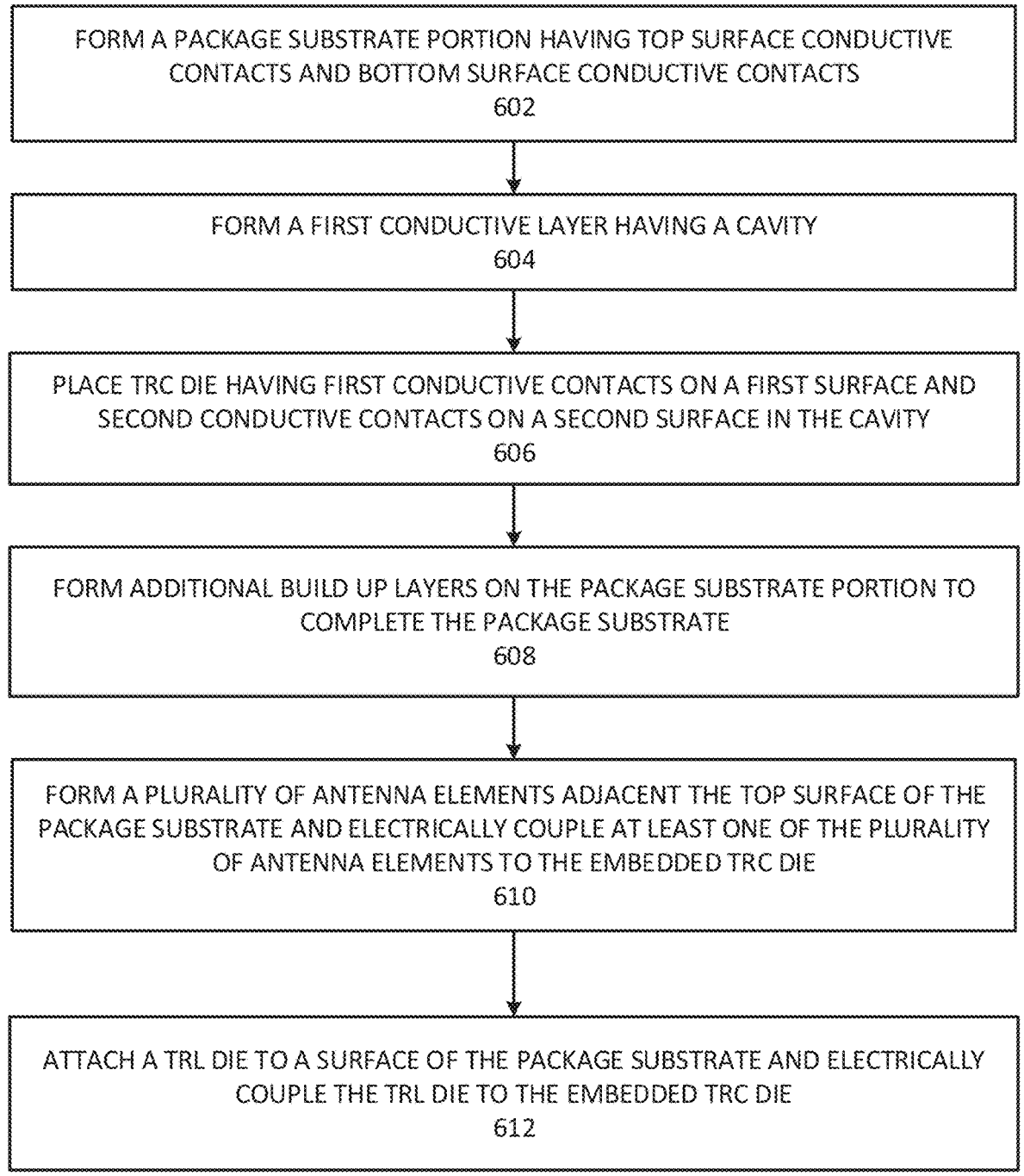
FIG. 6 is a process flow diagram of an example method of forming a microelectronic assembly having an embedded double-sided die, in accordance with various embodiments.

FIG. 6 is a process flow diagram of an example method of forming a microelectronic assembly, in accordance with various embodiments. At 602, a portion of a package substrate may be formed. The package substrate portion may have a top surface with top surface conductive contacts and an opposing bottom surface having bottom surface conductive contacts. The top surface of the package substrate portion may be the layer for embedding a die and coupling the die to the package substrate portion via the top surface conductive contacts. The package substrate portion may be coupled to a circuit board via the bottom surface conductive contacts. At 604, a first conductive layer having a cavity may be patterned and deposited on the top surface of the package substrate portion. The cavity may have the top surface conductive contacts of the package substrate portion on the bottom of the cavity. In some embodiments, the first conductive layer may have a plurality of cavities, such that a plurality of dies may be embedded in the same layer. At 606, a TRC die may be placed in the cavity. The TRC die may have a first surface with first conductive contacts and an opposing second surface with second conductive contacts. The TRC die may further have a non-electrical material covering the second conductive contacts. The TRC die may be placed in the cavity with the first conductive contacts facing the top surface conductive contacts on the package substrate portion. After placing the die in the cavity, first interconnects may be formed between the first conductive contacts on the die and the top surface conductive contacts on the package substrate portion. The first interconnects may include any suitable interconnect disclosed herein, including an anisotropic conductive material, a DAF, metal-to metal interconnects, and/or solder. If other dies, including other TRC dies, are being embedded in the first conductive layer, the additional dies may be placed in their respective cavity and interconnects may be formed between the first interconnects on die and the top conductive contacts on the package substrate portion. Further, after placing the die in the cavity, if the die has non-electrical material layer covering the second conductive contacts, the non-electrical material layer may be removed. At 608, additional build-up layers may be formed on the package substrate, such that the TRC die is embedded in the package substrate and electrically coupled to conductive pathways in the package substrate via the first and second conductive contacts. For example, additional conductive layers may be patterned and deposited, wherein the additional conductive layers may include a RF routing layer, and/or a conductive trace layer having a ground plane. At 610, a plurality of antenna elements may be formed on the top surface of the package substrate and electrically coupled to the embedded TRC die. At 612, a TRL die may be attached to the package substrate and electrically coupled to the embedded TRC die.

Other manufacturing technologies exist to make similar shaped vias. In an embodiment, the shaped via opening may be drilled using a RIE process that etches through a photo-resist layer or a hard mask layer. Additionally, the shaped via openings, including the RF vias, may be drilled with a line shaped laser beam. For example, the laser beam may be shaped either optically or mechanically. The shaped laser beam may be steered and positioned (e.g., with a scanning system) to target locations where a shaped via opening is desired. According to an embodiment, the laser may be a pulsed $CO_2$ laser or a Q-switched ultraviolet (UV) laser. Embodiments may use the UV laser when relatively small shaped via dimensions are desired.

Another embodiment may use a laser beam to scan over a mask which has the shaped via pattern and is projected to the work piece. The fluence of the laser on the work piece may be sufficiently high to ablate the dielectric material and form the shaped via opening. By way of example, the lasers in such an embodiment may include Q-switched solid-state UV lasers and excimer lasers. In embodiments that use either of the two previously described laser patterning processes to form the via openings, a photosensitive dielectric may not be used since the lasers themselves ablate the dielectric material and no exposure and developing processes may be performed.

Some methods disclosed herein may include forming the shaped via opening with a process that uses of a photosensitive dielectric. In such an embodiment, the photosensitive dielectric may be lithographically patterned and developed to form the shaped via openings. According to some embodiments, a post patterning cleaning process may also be included after the shaped via openings are formed. Embodiments may then include forming the shaped via in the opening with a metallization process, such as a semi-additive process (SAP).

The microelectronic assemblies disclosed herein may be included in any suitable electronic component. FIGS. 7-11 illustrate various examples of apparatuses that may include, or be included in, any of the microelectronic assemblies disclosed herein.

Figure 7:
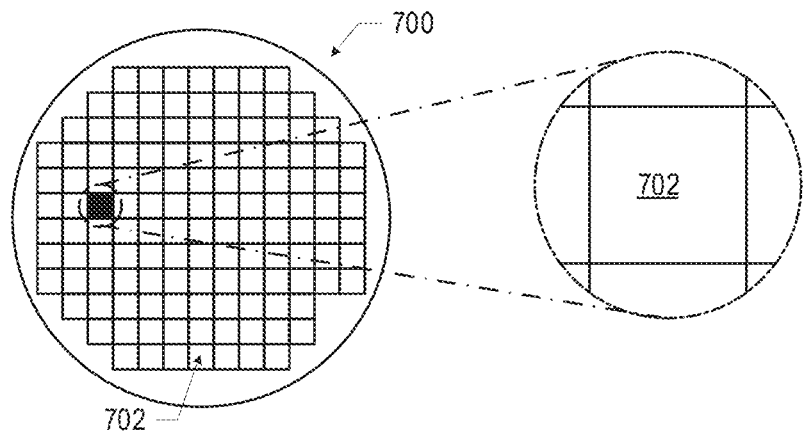
FIG. 7 is a top view of a wafer and dies that may be included in a microelectronic assembly, in accordance with any of the embodiments disclosed herein.

FIG. 7 is a top view of a wafer 700 and dies 702 that may be included in any of the microelectronic assemblies disclosed herein (e.g., any of the dies 114 disclosed herein). The wafer 700 may be composed of semiconductor material and may include one or more dies 702 having IC structures formed on a surface of the wafer 700. Each of the dies 702 may be a repeating unit of a semiconductor product that includes any suitable IC. After the fabrication of the semiconductor product is complete, the wafer 700 may undergo a singulation process in which the dies 702 are separated from one another to provide discrete "chips" of the semiconductor product. The die 702 may be any of the dies 114 disclosed herein. The die 702 may include one or more transistors (e.g., some of the transistors 840 of FIG. 8, discussed below), supporting circuitry to route electrical signals to the transistors, passive components (e.g., signal traces, resistors, capacitors, or inductors), and/or any other IC components. In some embodiments, the wafer 700 or the die 702 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 702. For example, a memory array formed by multiple memory devices may be formed on a same die 702 as a processing device (e.g., the processing device 1102 of FIG. 11) or other logic that is configured to store information in the memory devices or execute instructions stored in the memory array. Various ones of the microelectronic assemblies disclosed herein may be manufactured using a die-to-wafer assembly technique in which some dies are attached to a wafer 700 that include others of the dies, and the wafer 700 is subsequently singulated.

Figure 8:
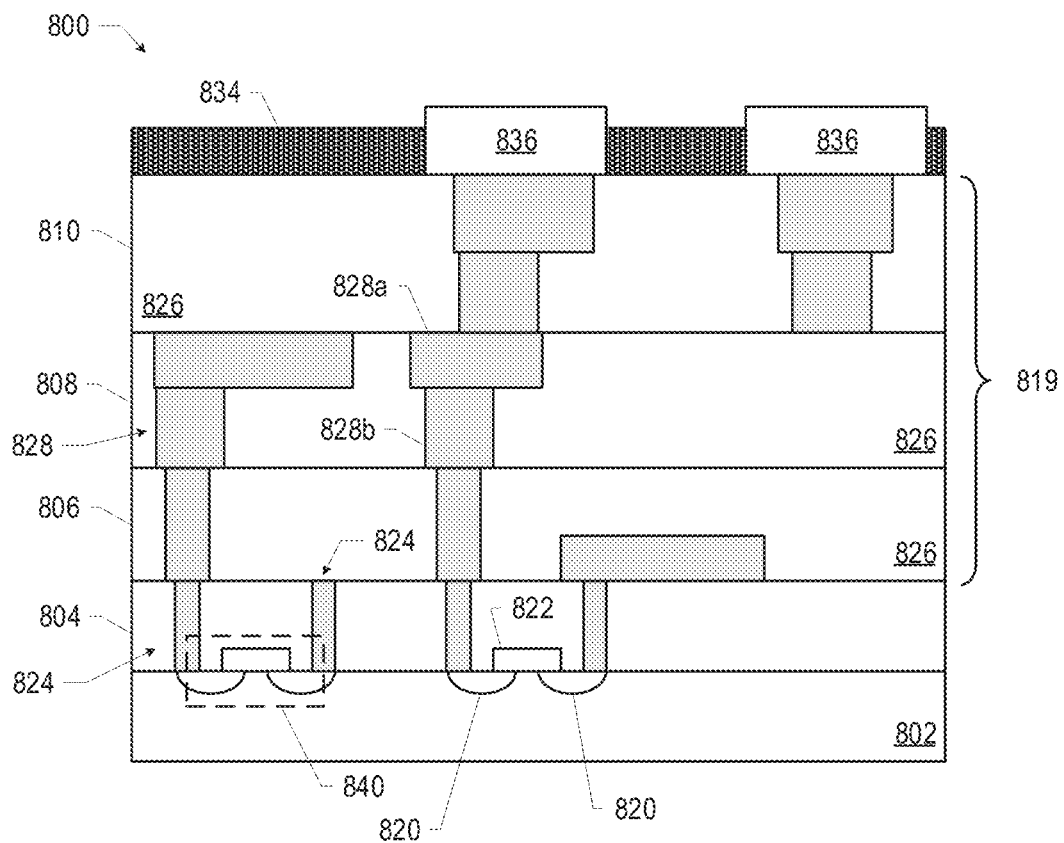
FIG. 8 is a cross-sectional side view of an integrated circuit device that may be included in a microelectronic assembly, in accordance with any of the embodiments disclosed herein.

FIG. 8 is a cross-sectional side view of an example IC device 800 that may be included in any of the microelectronic assemblies disclosed herein (e.g., in any of the dies 114). One or more of the IC devices 800 may be included in one or more dies 702 (FIG. 7). The IC device 800 may be formed on a substrate 802 (e.g., the wafer 700 of FIG. 7) and may be included in a die (e.g., the die 702 of FIG. 7). The substrate 802 may be a semiconductor substrate composed of semiconductor material systems including, for example, n-type or p-type materials systems (or a combination of both). The substrate 802 may include, for example, a crystalline substrate formed using a bulk silicon or a silicon-on-insulator (SOI) substructure. In some embodiments, the substrate 802 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 802. Although a few examples of materials from which the substrate 802 may be formed are described here, any material that may serve as a foundation for an IC device 800 may be used. The substrate 802 may be part of a singulated die (e.g., the dies 702 of FIG. 7) or a wafer (e.g., the wafer 700 of FIG. 7).

The IC device 800 may include one or more device layers 804 disposed on the substrate 802. The device layer 804 may include features of one or more transistors 840 (e.g., metal oxide semiconductor field-effect transistors (MOSFETs)) formed on the substrate 802 and/or any other active and/or passive circuitry as may be desired by a device manufacturer. The device layer 804 may include, for example, one or more source and/or drain (S/D) regions 820, a gate 822 to control current flow in the transistors 840 between the S/D regions 820, and one or more S/D contacts 824 to route electrical signals to/from the S/D regions 820. The transistors 840 may include additional features not depicted for the sake of clarity, such as device isolation regions, gate contacts, and the like. The transistors 840 are not limited to the type and configuration depicted in FIG. 8 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 840 may include a gate 822 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 840 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 840 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 820 may be formed within the substrate 802 adjacent to the gate 822 of each transistor 840. The S/D regions 820 may be formed using an implantation/diffusion process or an etching/deposition process, for example. In the former process, dopants such as boron, aluminum, antimony, phosphorous, or arsenic may be ion-implanted into the substrate 802 to form the S/D regions 820. An annealing process that activates the dopants and causes them to diffuse farther into the substrate 802 may follow the ion-implantation process. In the latter process, the substrate 802 may first be etched to form recesses at the locations of the S/D regions 820. An epitaxial deposition process may then be carried out to fill the recesses with material that is used to fabricate the S/D regions 820. In some implementations, the S/D regions 820 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 820 may be formed using one or more alternate semiconductor materials such as germanium or a group III-V material or alloy. In further embodiments, one or more layers of metal and/or metal alloys may be used to form the S/D regions 820.

Electrical signals, such as power and/or input/output (I/O) signals, may be routed to and/or from the devices (e.g., transistors 840) of the device layer 804 through one or more interconnect layers disposed on the device layer 804 (illustrated in FIG. 8 as interconnect layers 806, 808, and 810). For example, electrically conductive features of the device layer 804 (e.g., the gate 822 and the S/D contacts 824) may be electrically coupled with the interconnect structures 828 of the interconnect layers 806-810. The one or more interconnect layers 806-810 may form a metallization stack (also referred to as an "ILD stack") 819 of the IC device 800.

The interconnect structures 828 may be arranged within the interconnect layers 806-810 to route electrical signals according to a wide variety of designs. In particular, the arrangement is not limited to the particular configuration of interconnect structures 828 depicted in FIG. 8. For example, the interconnect structures may be arranged as multidirectional interconnect structures. Although a particular number of interconnect layers 806-810 is depicted in FIG. 8, some embodiments of the present disclosure include IC devices having more or fewer interconnect layers than depicted.

In some embodiments, the interconnect structures 828 may include lines 828a and/or vias 828b filled with an electrically conductive material such as a metal. The lines 828a may be arranged to route electrical signals in a direction of a plane that is substantially parallel with a surface of the substrate 802 upon which the device layer 804 is formed. For example, the lines 828a may route electrical signals in a direction in and out of the page from the perspective of FIG. 8. The vias 828b may be arranged to route electrical signals in a direction of a plane that is substantially perpendicular to the surface of the substrate 802 upon which the device layer 804 is formed. In some embodiments, the vias 828b may electrically couple lines 828a of different interconnect layers 806-810 together.

The interconnect layers 806-810 may include a dielectric material 826 disposed between the interconnect structures 828, as shown in FIG. 8. In some embodiments, the dielectric material 826 disposed between the interconnect structures 828 in different ones of the interconnect layers 806-810 may have different compositions; in other embodiments, the composition of the dielectric material 826 between different interconnect layers 806-810 may be the same.

A first interconnect layer 806 (referred to as Metal 1 or "M1") may be formed directly on the device layer 804. In some embodiments, the first interconnect layer 806 may include lines 828a and/or vias 828b, as shown. The lines 828a of the first interconnect layer 806 may be coupled with contacts (e.g., the S/D contacts 824) of the device layer 804.

A second interconnect layer 808 (referred to as Metal 2 or "M2") may be formed directly on the first interconnect layer 806. In some embodiments, the second interconnect layer 808 may include vias 828b to couple the lines 828a of the second interconnect layer 808 with the lines 828a of the first interconnect layer 806. Although the lines 828a and the vias 828b are structurally delineated with a line within each interconnect layer (e.g., within the second interconnect layer 808) for the sake of clarity, the lines 828a and the vias 828b may be structurally and/or materially contiguous (e.g., simultaneously filled during a dual-damascene process) in some embodiments.

A third interconnect layer 810 (referred to as Metal 3 or "M3") (and additional interconnect layers, as desired) may be formed in succession on the second interconnect layer 808 according to similar techniques and configurations described in connection with the second interconnect layer 808 or the first interconnect layer 806. In some embodiments, the interconnect layers that are "higher up" in the metallization stack 819 in the IC device 800 (i.e., farther away from the device layer 804) may be thicker.

The IC device 800 may include a solder resist material 834 (e.g., polyimide or similar material) and one or more conductive contacts 836 formed on the interconnect layers 806-810. In FIG. 8, the conductive contacts 836 are illustrated as taking the form of bond pads. The conductive contacts 836 may be electrically coupled with the interconnect structures 828 and configured to route the electrical signals of the transistor(s) 840 to other external devices. For example, solder bonds may be formed on the one or more conductive contacts 836 to mechanically and/or electrically couple a chip including the IC device 800 with another component (e.g., a circuit board). The IC device 800 may include additional or alternate structures to route the electrical signals from the interconnect layers 806-810; for example, the conductive contacts 836 may include other analogous features (e.g., posts) that route the electrical signals to external components. The conductive contacts 836 may serve as the conductive contacts 122 or 124, as appropriate.

In embodiments in which the IC device 800 is a double-sided die (e.g., like the die 114), the IC device 800 may include another metallization stack (not shown) on the opposite side of the device layer(s) 804. This metallization stack, may include multiple interconnect layers as discussed above with reference to the interconnect layers 806-810, to provide conductive pathways (e.g., including conductive lines and vias) between the device layer(s) 804 and additional conductive contacts (not shown) on the opposite side of the IC device 800 from the conductive contacts 836. These additional conductive contacts may serve as the conductive contacts 122 or 124, as appropriate. Example details of a double-sided IC device are discussed in further detail in FIG. 9.

Figure 9:
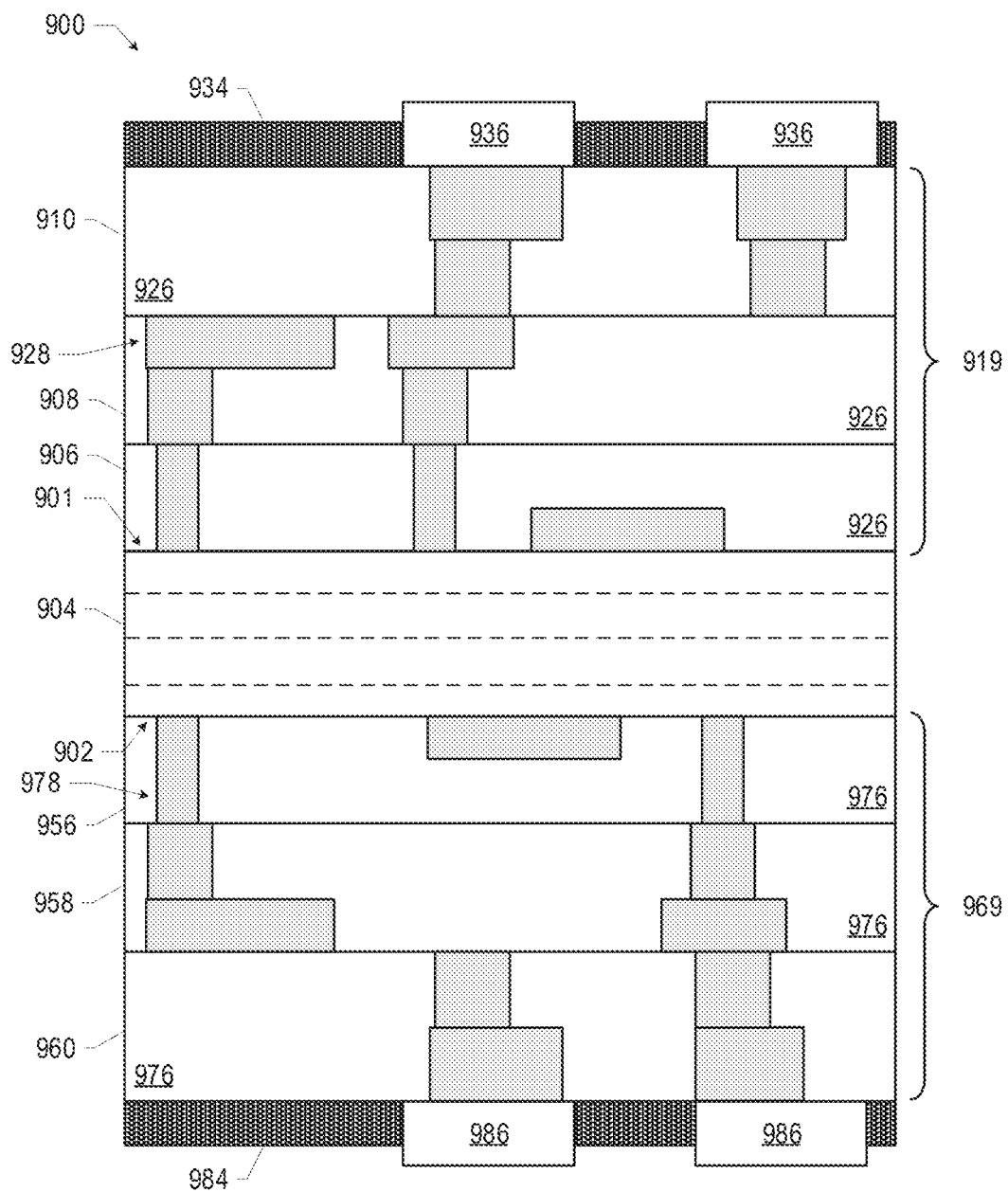
FIG. 9 is a cross-sectional side view of one example of a double-sided integrated circuit device that may be included in a microelectronic assembly, in accordance with any of the embodiments disclosed herein.

FIG. 9 is a side, cross-sectional view of one example type of a double-sided IC device 900 that may be included in any of the microelectronic assemblies disclosed herein (e.g., in any of the dies 114). One or more of the double-sided IC devices 900 may be included in one or more dies 702 (FIG. 7). The double-sided IC device 900 may be composed of semiconductor material systems including, for example, n-type or p-type materials systems (or a combination of both). In some embodiments, the IC device may be composed of alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the double-sided IC device 900.

The double-sided IC device 900 may include one or more device layers 904. The device layers 904 may include features of one or more transistors (e.g., as discussed in FIG.

8) and/or any other active and/or passive circuitry as may be desired by a device manufacturer.

Electrical signals, such as power and/or input/output (I/O) signals, may be routed to and/or from the devices of the device layers 904 through one or more interconnect layers disposed on opposing sides of the device layers 904 (illustrated in FIG. 9 as first interconnect layers 906, 908, and 910 on a first side 901 of the device layers and second interconnect layers 956, 958, and 960 on an opposing second side 902 of the device layers 904). For example, electrically conductive features of the device layers 904 may be electrically coupled with the first interconnect structures 928 of the first interconnect layers 906-910 and/or with the second interconnect structures 978 of the second interconnect layers 956-960. The one or more first interconnect layers 906-910 may form a first metallization stack (e.g., an ILD stack) 919 and the one or more second interconnect layers 956-960 may form a second metallization stack 969 of the double-sided IC device 900.

The first interconnect structures 928 may be arranged within the first interconnect layers 906-910 and the second interconnect structures 978 may be arranged within the second interconnect layers 956-960 to route electrical signals according to a wide variety of designs (in particular, the arrangement is not limited to the particular configuration of the first interconnect structures 928 and the second interconnect structures 978 depicted in FIG. 9). For example, the first and/or second interconnect structures may be arranged as multidirectional interconnect structures. Although a particular number of first interconnect layers 906-910 and a particular number of second interconnect layers 956-960 are depicted in FIG. 9, some embodiments of the present disclosure include IC devices having more or fewer first and/or second interconnect layers than depicted. Further, the particular number of first interconnect layers and second interconnect layers on opposing sides of the device layers 904 may be the same or different from each other.

In some embodiments, the first interconnect structures 928 and/or the second interconnect structures 978 may include lines and/or vias as discussed herein filled with an electrically conductive material such as a metal. The first interconnect layers 906-910 may include a first dielectric material 926 disposed between the first interconnect structures 928, as shown in FIG. 9. In some embodiments, the first dielectric material 926 disposed between the first interconnect structures 928 in different ones of the first interconnect layers 906-910 may have different compositions; in other embodiments, the composition of the first dielectric material 926 between different first interconnect layers 906-910 may be the same. The second interconnect layers 956-960 may include a second dielectric material 976 disposed between the second interconnect structures 978, as shown in FIG. 9. In some embodiments, the second dielectric material 976 disposed between the second interconnect structures 978 in different ones of the second interconnect layers 956-960 may have different compositions; in other embodiments, the composition of the second dielectric material 976 between different second interconnect layers 956-960 may be the same. In some embodiments, the composition of the first dielectric material 926 and the second dielectric material 978 may be different; in other embodiments, the composition of the first dielectric material 926 and the second dielectric material may be the same. The first interconnect layers 906-910 and the second interconnect layers 956-960 may be formed using any techniques as discussed herein (e.g., composed of M1-M3 layers, etc.).

The double-sided IC device 900 may include a first solder resist material 934 (e.g., polyimide or similar material) and one or more first conductive contacts 936 formed on the first interconnect layers 906-910. The double-sided IC device 900 may include a second solder resist material 984 (e.g., polyimide or similar material) and one or more second conductive contacts 986 formed on the second interconnect layers 956-960. In some embodiments, the composition of the first solder resist material 934 and the second solder resist material 984 may be the same; in other embodiments, the composition of the first solder resist material 934 and the second solder resist material 984 may be different.

In FIG. 9, the first conductive contacts 936 and the second conductive contacts 986 are illustrated as taking the form of bond pads. The first conductive contacts 936 may be electrically coupled with the first interconnect structures 928 and the second conductive contacts 986 may be electrically coupled with the second interconnect structures 978. In some embodiments, TSV interconnect structures may be integrated into the double-sided IC device 900; in such embodiments, the first conductive contacts 936 and the second conductive contacts 986 may be electrically coupled via one or more TSV interconnect structures. The double-sided IC device 900 may include additional or alternate structures to route the electrical signals from the first interconnect layers 906-910 and/or the second interconnect structures 956-960; for example, the first conductive contacts 936 and/or the second conductive contacts 986 may include other analogous features (e.g., posts) that route the electrical signals to external components. The conductive contacts 936 and/or 986 may serve as the conductive contacts 122 or 124, as appropriate.

Figure 10:
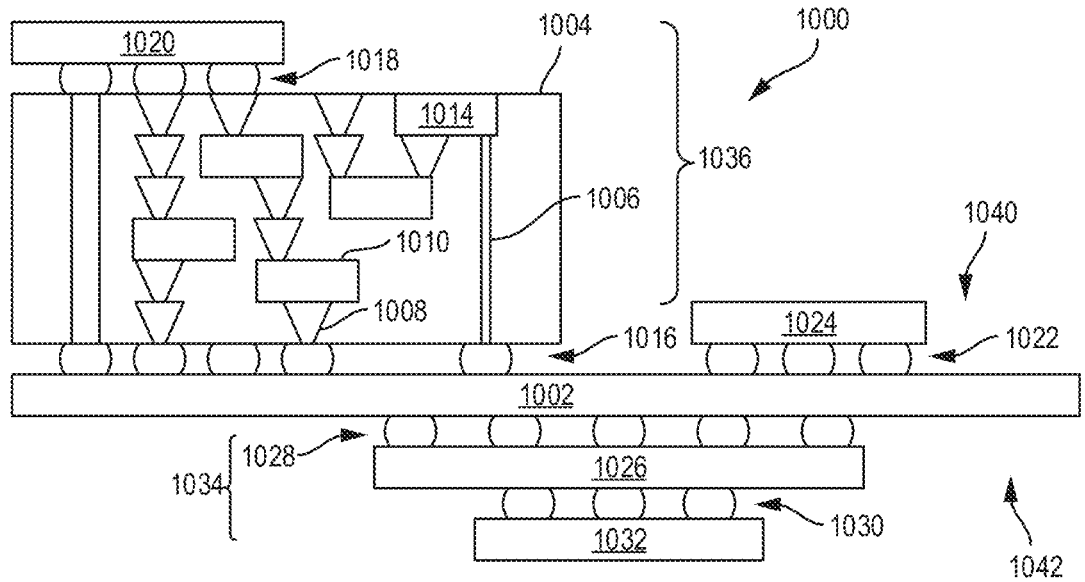
FIG. 10 is a cross-sectional side view of an integrated circuit device assembly that may include a microelectronic assembly, in accordance with any of the embodiments disclosed herein.

FIG. 10 is a cross-sectional side view of an IC device assembly 1000 that may include any of the microelectronic assemblies disclosed herein. In some embodiments, the IC device assembly 1000 may be a microelectronic assembly. The IC device assembly 1000 includes a number of components disposed on a circuit board 1002 (which may be, e.g., a motherboard). The IC device assembly 1000 includes components disposed on a first face 1040 of the circuit board 1002 and an opposing second face 1042 of the circuit board 1002; generally, components may be disposed on one or both faces 1040 and 1042. Any of the IC packages discussed below with reference to the IC device assembly 1000 may take the form of any suitable ones of the embodiments of the microelectronic assemblies disclosed herein.

In some embodiments, the circuit board 1002 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1002. In other embodiments, the circuit board 1002 may be a non-PCB substrate.

The IC device assembly 1000 illustrated in FIG. 10 includes a package-on-interposer structure 1036 coupled to the first face 1040 of the circuit board 1002 by coupling components 1016. The coupling components 1016 may electrically and mechanically couple the package-on-interposer structure 1036 to the circuit board 1002, and may include solder balls (as shown in FIG. 10), male and female portions of a socket, an adhesive, an underfill material, and/or any other suitable electrical and/or mechanical coupling structure.

The package-on-interposer structure 1036 may include an IC package 1020 coupled to an interposer 1004 by coupling components 1018. The coupling components 1018 may take any suitable form for the application, such as the forms discussed above with reference to the coupling components 1016. Although a single IC package 1020 is shown in FIG. 10, multiple IC packages may be coupled to the interposer 1004; indeed, additional interposers may be coupled to the interposer 1004. The interposer 1004 may provide an intervening substrate used to bridge the circuit board 1002 and the IC package 1020. The IC package 1020 may be or include, for example, a die (the die 702 of FIG. 7), an IC device (e.g., the IC device 800 of FIG. 8 or the double-sided IC device 900 of FIG. 9), or any other suitable component. Generally, the interposer 1004 may spread a connection to a wider pitch or reroute a connection to a different connection. For example, the interposer 1004 may couple the IC package 1020 (e.g., a die) to a set of ball grid array (BGA) conductive contacts of the coupling components 1016 for coupling to the circuit board 1002. In the embodiment illustrated in FIG. 10, the IC package 1020 and the circuit board 1002 are attached to opposing sides of the interposer 1004; in other embodiments, the IC package 1020 and the circuit board 1002 may be attached to a same side of the interposer 1004. In some embodiments, three or more components may be interconnected by way of the interposer 1004.

In some embodiments, the interposer 1004 may be formed as a PCB, including multiple metal layers separated from one another by layers of dielectric material and interconnected by electrically conductive vias. In some embodiments, the interposer 1004 may be formed of an epoxy resin, a fiberglass-reinforced epoxy resin, an epoxy resin with inorganic fillers, a ceramic material, or a polymer material such as polyimide. In some embodiments, the interposer 1004 may be formed of alternate rigid or flexible materials that may include the same materials described above for use in a semiconductor substrate, such as silicon, germanium, and other group III-V and group IV materials. The interposer 1004 may include metal interconnects 1008 and vias 1010, including but not limited to TSVs 1006. The interposer 1004 may further include embedded devices 1014, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, power amplifiers, power management devices, antennas, arrays, sensors, and microelectromechanical systems (MEMS) devices may also be formed on the interposer 1004. The package-on-interposer structure 1036 may take the form of any of the package-on-interposer structures known in the art.

The IC device assembly 1000 may include an IC package 1024 coupled to the first face 1040 of the circuit board 1002 by coupling components 1022. The coupling components 1022 may take the form of any of the embodiments discussed above with reference to the coupling components 1016, and the IC package 1024 may take the form of any of the embodiments discussed above with reference to the IC package 1020.

The IC device assembly 1000 illustrated in FIG. 10 includes a package-on-package structure 1034 coupled to the second face 1042 of the circuit board 1002 by coupling components 1028. The package-on-package structure 1034 may include an IC package 1026 and an IC package 1032 coupled together by coupling components 1030 such that the IC package 1026 is disposed between the circuit board 1002 and the IC package 1032. The coupling components 1028 and 1030 may take the form of any of the embodiments of the coupling components 1016 discussed above, and the IC packages 1026 and 1032 may take the form of any of the embodiments of the IC package 1020 discussed above. The package-on-package structure 1034 may be configured in accordance with any of the package-on-package structures known in the art.

Figure 11:
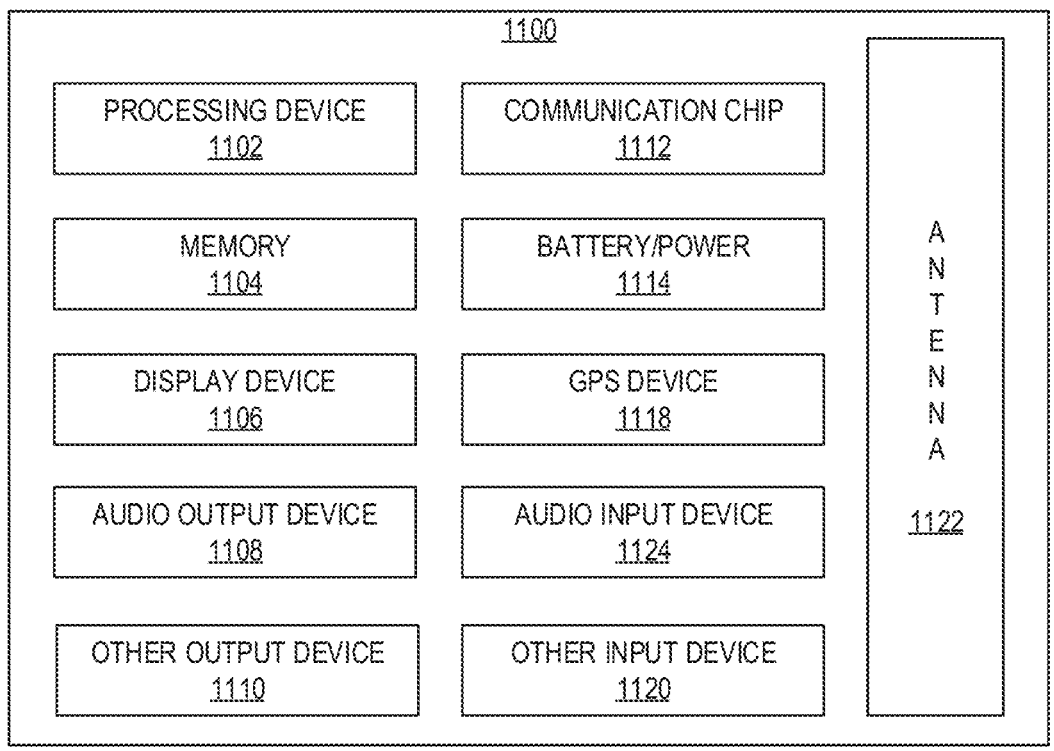
FIG. 11 is a block diagram of an example electrical device that may include a microelectronic, in accordance with any of the embodiments disclosed herein.

FIG. 11 is a block diagram of an example electrical device 1100 that may include one or more of the microelectronic assemblies disclosed herein. For example, any suitable ones of the components of the electrical device 1100 may include one or more of the IC device assemblies 1000, IC devices 800, double-sided IC devices 900 or dies 702 disclosed herein, and may be arranged in any of the microelectronic assemblies disclosed herein. A number of components are illustrated in FIG. 11 as included in the electrical device 1100, but any one or more of these components may be omitted or duplicated, as suitable for the application. In some embodiments, some or all of the components included in the electrical device 1100 may be attached to one or more motherboards. In some embodiments, some or all of these components are fabricated onto a single system-on-a-chip (SoC) die.

Additionally, in various embodiments, the electrical device 1100 may not include one or more of the components illustrated in FIG. 11, but the electrical device 1100 may include interface circuitry for coupling to the one or more components. For example, the electrical device 1100 may not include a display device 1106, but may include display device interface circuitry (e.g., a connector and driver circuitry) to which a display device 1106 may be coupled. In another set of examples, the electrical device 1100 may not include an audio input device 1124 or an audio output device 1108, but may include audio input or output device interface circuitry (e.g., connectors and supporting circuitry) to which an audio input device 1124 or audio output device 1108 may be coupled.

The electrical device 1100 may include a processing device 1102 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1102 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1100 may include a memory 1104, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, the memory 1104 may include memory that shares a die with the processing device 1102. This memory may be used as cache memory and may include embedded dynamic random access memory (eDRAM) or spin transfer torque magnetic random access memory (STT-M RAM).

In some embodiments, the electrical device 1100 may include a communication chip 1112 (e.g., one or more communication chips). For example, the communication chip 1112 may be configured for managing wireless communications for the transfer of data to and from the electrical device 1100. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1112 may implement any of a number of wireless standards or protocols, including but not limited to Institute of Electrical and Electronic Engineers (IEEE) standards including Wi-Fi (IEEE 802.11 family), IEEE 802.16 standards (e.g., IEEE 802.16-2005 Amendment), 3rd Generation Partnership Project (3GPP) Long-Term Evolution (LTE), 5G, 5G New Radio, along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1112 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1112 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1112 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1112 may operate in accordance with other wireless protocols in other embodiments. The electrical device 1100 may include an antenna 1122 to facilitate wireless communications and/or to receive other wireless communications (such as AM or FM radio transmissions).

In some embodiments, the communication chip 1112 may manage wired communications, such as electrical, optical, or any other suitable communication protocols (e.g., the Ethernet). As noted above, the communication chip 1112 may include multiple communication chips. For instance, a first communication chip 1112 may be dedicated to shorter-range wireless communications such as Wi-Fi or Bluetooth, and a second communication chip 1112 may be dedicated to longer-range wireless communications such as global positioning system (GPS), EDGE, GPRS, CDMA, WiMAX, LTE, EV-DO, or others. In some embodiments, a first communication chip 1112 may be dedicated to wireless communications, and a second communication chip 1112 may be dedicated to wired communications.

The electrical device 1100 may include battery/power circuitry 1114. The battery/power circuitry 1114 may include one or more energy storage devices (e.g., batteries or capacitors) and/or circuitry for coupling components of the electrical device 1100 to an energy source separate from the electrical device 1100 (e.g., AC line power).

The electrical device 1100 may include a display device 1106 (or corresponding interface circuitry, as discussed above). The display device 1106 may include any visual indicators, such as a heads-up display, a computer monitor, a projector, a touchscreen display, a liquid crystal display (LCD), a light-emitting diode display, or a flat panel display.

The electrical device 1100 may include an audio output device 1108 (or corresponding interface circuitry, as discussed above). The audio output device 1108 may include any device that generates an audible indicator, such as speakers, headsets, or earbuds.

The electrical device 1100 may include an audio input device 1124 (or corresponding interface circuitry, as discussed above). The audio input device 1124 may include any device that generates a signal representative of a sound, such as microphones, microphone arrays, or digital instruments (e.g., instruments having a musical instrument digital interface (MIDI) output).

The electrical device 1100 may include a GPS device 1118 (or corresponding interface circuitry, as discussed above). The GPS device 1118 may be in communication with a satellite-based system and may receive a location of the electrical device 1100, as known in the art.

The electrical device 1100 may include another output device 1110 (or corresponding interface circuitry, as discussed above). Examples of the other output device 1110 may include an audio codec, a video codec, a printer, a wired or wireless transmitter for providing information to other devices, or an additional storage device.

The electrical device 1100 may include another input device 1120 (or corresponding interface circuitry, as discussed above). Examples of the other input device 1120 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1100 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some embodiments, the electrical device 1100 may be any other electronic device that processes data.

The following paragraphs provide various examples of the embodiments disclosed herein.

Example 1 is a microelectronic assembly, including: a package substrate having a first surface and an opposing second surface; a transmitter/receiver logic (TRL) die coupled to the first or second surface of the package substrate; a plurality of antenna elements adjacent the second surface of the package substrate; and a transmitter/receiver chain (TRC) die, wherein the TRC die is embedded in the package substrate, and wherein the TRC die is electrically coupled to the TRL die and at least one of the plurality of antenna elements via conductive pathways in the package substrate.

Example 2 may include the subject matter of Example 1, and may further specify that the TRC die is electrically coupled to two or more of the plurality of antenna elements.

Example 3 may include the subject matter of Example 1, and may further specify that the TRC die is a double-sided die.

Example 4 may include the subject matter of Example 1, and may further specify that the TRC die includes a low noise amplifier.

Example 5 may include the subject matter of Example 1, and may further specify that the TRC die includes a high power amplifier.

Example 6 may include the subject matter of Example 1, and may further specify that the TRC die includes an oscillator.

Example 7 may include the subject matter of Example 1, and may further specify that the TRC die includes a phase shifter.

Example 8 may include the subject matter of Example 1, and may further specify that a transmission direction is a same direction as a reception direction.

Example 9 may include the subject matter of Example 1, and may further specify that a transmission direction is independent of a reception direction.

Example 10 may include the subject matter of Example 1, and may further specify that the TRC die further is electrically coupled to a power plane in the package substrate.

Example 11 may include the subject matter of Example 1, and may further specify that the TRL die includes a modem.

Example 12 may include the subject matter of Example 1, and may further specify that the TRL die includes logic circuits.

Example 13 may include the subject matter of Example 1, and may further specify that the TRL die includes a phase shifter.

Example 14 may include the subject matter of Example 1, and may further specify that the TRC die is electrically coupled to the conductive pathways in the package substrate via conductive contacts on a surface of the TRC die, and wherein the conductive contacts include an anisotropic conductive material.

Example 15 may include the subject matter of Example 1, and may further specify that the TRC die is electrically coupled to the conductive pathways in the package substrate via conductive contacts on a surface of the TRC die, and wherein the conductive contacts include a die attach film.

Example 16 may include the subject matter of Example 1, and may further specify that the TRC die is electrically coupled to the conductive pathways in the package substrate via conductive contacts on a surface of the TRC die, and wherein the conductive contacts include metal-to-metal interconnects.

Example 17 may include the subject matter of Example 1, and may further specify that the TRL die is electrically coupled to the package substrate via first interconnects, and wherein the first interconnects include solder.

Example 18 may include the subject matter of Example 1, and may further specify that the TRC die is a first TRC die and is electrically coupled to a first one of the plurality of antenna elements, and may further include: a second TRC die, wherein the second TRC die is embedded in the package substrate, and wherein the second TRC die is electrically coupled to the TRL die and at least a second one of the plurality of antenna elements via conductive pathways in the package substrate.

Example 19 may include the subject matter of Example 18, and may further specify that the first one of the plurality of antenna elements and the second one of the plurality of antenna elements is a same antenna element.

Example 20 may include the subject matter of Example 18, and may further specify that the first one of the plurality of antenna elements and the second one of the plurality of antenna elements are different antenna elements.

Example 21 may include the subject matter of Example 1, and may further include: a circuit board, wherein the circuit board is electrically coupled to the first surface of the package substrate.

Example 22 may include the subject matter of any of Examples 1-21, and may further specify that the microelectronic assembly is included in a server device.

Example 23 may include the subject matter of any of Examples 1-21, and may further specify that the microelectronic assembly is included in a portable computing device.

Example 24 may include the subject matter of any of Examples 1-21, and may further specify that the microelectronic assembly included in a wearable computing device.

Example 25 may include the subject matter of Example 1, and may further specify that the conductive pathways in the package substrate electrically coupling the TRL die to the TRC die have a thickness between 1 um and 100 um.

Example 26 may include the subject matter of Example 1, and may further specify that the conductive pathways in the package substrate electrically coupling the TRL die to the TRC die have a thickness between 10 um and 40 um.

Example 27 may include the subject matter of Example 1, and may further specify that the plurality of antenna elements is to transmit or receive a millimeter wave signal.

Example 28 may include the subject matter of Example 1, and may further specify that the plurality of antenna elements is a single-layer antenna array.

Example 29 may include the subject matter of Example 1, and may further specify that the plurality of antenna elements includes: a first layer of antenna elements; and a second layer of antenna elements, wherein the second layer of antenna elements is separated from the first layer of antenna elements by a dielectric layer.

Example 30 may include the subject matter of Example 29, and may further specify that the first layer of antenna elements is capacitively coupled to the second layer of antenna elements.

Example 31 is a microelectronic assembly, including: a package substrate having a first surface and an opposing second surface; a transmitter/receiver logic (TRL) die coupled to the first surface of the package substrate; a plurality of antenna elements on the second surface of the package substrate; and a transmitter/receiver chain (TRC) die having a first surface with first conductive contacts and an opposing second surface with second conductive contacts, wherein the TRC die is embedded in the package substrate, and wherein the second conductive contacts are electrically coupled to the TRL die and to at least one of the plurality of antenna elements via conductive pathways in the package substrate.

Example 32 may include the subject matter of Example 31, and may further specify that the TRC die is electrically coupled to two or more of the plurality of antenna elements.

Example 33 may include the subject matter of Example 31, and may further specify that the TRC die is a double-sided die.

Example 34 may include the subject matter of Example 31, and may further specify that the TRC die includes a low noise amplifier.

Example 35 may include the subject matter of Example 31, and may further specify that the TRC die includes a high power amplifier.

Example 36 may include the subject matter of Example 31, and may further specify that the TRC die includes an oscillator.

Example 37 may include the subject matter of Example 31, and may further specify that the TRC die includes a phase shifter.

Example 38 may include the subject matter of Example 31, and may further specify that a transmission direction is a same direction as a reception direction.

Example 39 may include the subject matter of Example 31, and may further specify that a transmission direction is independent of a reception direction.

Example 40 may include the subject matter of Example 31, and may further specify that the TRC die further is electrically coupled to a power plane in the package substrate via the first conductive contacts.

Example 41 may include the subject matter of Example 31, and may further specify that the TRL die includes a modem.

Example 42 may include the subject matter of Example 31, and may further specify that the TRL die includes logic circuits.

Example 43 may include the subject matter of Example 31, and may further specify that the TRL die includes a phase shifter.

Example 44 may include the subject matter of Example 31, and may further specify that the second conductive contacts include an anisotropic conductive material.

Example 45 may include the subject matter of Example 31, and may further specify that the second conductive contacts include a die attach film.

Example 46 may include the subject matter of Example 31, and may further specify that the second conductive contacts include metal-to-metal interconnects.

Example 47 may include the subject matter of Example 31, and may further specify that the TRL die is electrically coupled to the package substrate via third interconnects, and wherein the third interconnects include solder.

Example 48 may include the subject matter of Example 31, and may further specify that the TRC die is a first TRC die and is electrically coupled to a first one of the plurality of antenna elements, and may further include: a second TRC die having a first surface with first conductive contacts and an opposing second surface with second conductive contacts, wherein the second TRC die is embedded in the package substrate, and wherein the second conductive contacts are electrically coupled to the TRL die and to at least a second one of the plurality of antenna elements and the first conductive contacts are electrically coupled to a power plane via conductive pathways in the package substrate.

Example 49 may include the subject matter of Example 48, and may further specify that the first one of the plurality of antenna elements and the second one of the plurality of antenna elements are a same antenna element.

Example 50 may include the subject matter of Example 48, and may further specify that the first one of the plurality of antenna elements and the second one of the plurality of antenna elements are different antenna elements.

Example 51 may include the subject matter of Example 31, and may further include: a circuit board, wherein the circuit board is electrically coupled to the first surface of the package substrate.

Example 52 may include the subject matter of any of Examples 31-51, and may further specify that the microelectronic assembly is included in a server device.

Example 53 may include the subject matter of any of Examples 31-51, and may further specify that the microelectronic assembly is included in a portable computing device.

Example 54 may include the subject matter of any of Examples 31-51, and may further specify that the microelectronic assembly included in a wearable computing device.

Example 55 may include the subject matter of Example 31, and may further specify that the conductive pathways in the package substrate electrically coupling the TRL die to the TRC die have a thickness of 1 um to 100 um.

Example 56 may include the subject matter of Example 31, and may further specify that the conductive pathways in the package substrate electrically coupling the TRL die to the TRC die have a thickness of 10 um to 40 um.

Example 57 may include the subject matter of Example 31, and may further specify that the plurality of antenna elements is to transmit or receive a millimeter wave signal.

Example 58 may include the subject matter of Example 31, and may further specify that the plurality of antenna elements is a single-layer antenna array.

Example 59 may include the subject matter of Example 31, and may further specify that the plurality of antenna elements includes: a first layer of antenna elements; and a second layer of antenna elements, wherein the second layer of antenna elements is separated from the first layer of antenna elements by a dielectric layer.

Example 60 may include the subject matter of Example 59, and may further specify that the first layer of antenna elements is capacitively coupled to the second layer of antenna elements.

Example 61 is a method of manufacturing a microelectronic assembly, including: forming a package substrate portion, wherein the package substrate portion has a top surface with top conductive contacts and an opposing bottom surface having bottom conductive contacts; forming a conductive layer on the top surface of the package substrate portion, wherein the conductive layer includes a cavity; placing a transmitter/receiver chain (TRC) die in the cavity, wherein the TRC die has a first surface with first conductive contacts and an opposing second surface with second conductive contacts; forming first interconnects between the first conductive contacts of the die and the top conductive contacts of the package substrate portion; forming additional build-up layers on the top surface of the package substrate portion; forming a plurality of antenna elements, wherein the plurality of antenna elements is on an uppermost build-up layer and wherein at least one of the plurality of antenna elements is electrically coupled to the TRC die; and electrically coupling a transmitter/receiver logic (TRL) die to the bottom surface of the package substrate portion and to the TRL die.

Example 62 may include the subject matter of Example 61, and may further specify that forming the conductive layer includes: depositing a photoresist layer on the top surface of the package substrate portion; forming an opening in the photoresist layer; depositing conductive material in the opening; and removing the photoresist layer.

Example 63 may include the subject matter of Example 62, and may further specify that forming the conductive layer further includes: depositing a seed layer on the top surface of the package substrate portion before depositing the photoresist layer.

Example 64 may include the subject matter of Example 61, and may further specify that placing the TRC die in the cavity includes: positioning the TRC die in the cavity while the TRC die is coupled to a carrier; and removing the carrier.

Example 65 may include the subject matter of Example 61, and may further specify that electrically coupling the TRL die to the bottom surface of the package substrate portion includes: forming second level interconnects on the bottom surface of the package substrate portion.

Example 66 may include the subject matter of Example 61, and may further specify that forming a plurality of antenna elements includes: forming a first layer of antenna elements; forming a dielectric layer; and forming a second layer of antenna elements, wherein the second layer of antenna elements is separated from the first layer of antenna elements by the dielectric layer.

Example 67 may include the subject matter of Example 61, and may further specify that the TRC die includes: an amplifier.

Example 68 may include the subject matter of Example 61, and may further specify that the TRL die includes: logic circuits; a modem; and a phase shifter.

The invention claimed is:

1. A microelectronic assembly, comprising:
    a package substrate having a first surface and an opposing second surface;
    a transmitter/receiver logic (TRL) die coupled to the first or second surface of the package substrate;
    a plurality of antenna elements adjacent the second surface of the package substrate; and
    a transmitter/receiver chain (TRC) die, wherein the TRC die is embedded in the package substrate, and wherein the TRC die is electrically coupled to the TRL die and at least one of the plurality of antenna elements via conductive pathways in the package substrate.

2. The microelectronic assembly of claim 1, wherein the TRC die is electrically coupled to two or more of the plurality of antenna elements.

3. The microelectronic assembly of claim 1, wherein the TRC die is a double-sided die.

4. The microelectronic assembly of claim 1, wherein the TRC die comprises a low noise amplifier.

5. The microelectronic assembly of claim 1, wherein the TRC die comprises a high power amplifier.

6. The microelectronic assembly of claim 1, wherein a transmission direction is a same direction as a reception direction.

7. The microelectronic assembly of claim 1, wherein a transmission direction is independent of a reception direction.

8. The microelectronic assembly of claim 1, wherein the TRL die comprises a modem.

9. The microelectronic assembly of claim 1, wherein the TRL die comprises logic circuits.

10. The microelectronic assembly of claim 1, wherein the TRL die comprises a phase shifter.

11. A microelectronic assembly, comprising:
    a package substrate having a first surface and an opposing second surface;
    a transmitter/receiver logic (TRL) die coupled to the first or second surface of the package substrate;
    a plurality of antenna elements adjacent the second surface of the package substrate;
    a first transmitter/receiver chain (TRC) die, wherein the first TRC die is embedded in the package substrate, and wherein the first TRC die is electrically coupled to the TRL die and at least a first one of the plurality of antenna elements via conductive pathways in the package substrate; and
    a second TRC die, wherein the second TRC die is embedded in the package substrate, and wherein the second TRC die is electrically coupled to the TRL die and at least a second one of the plurality of antenna elements via conductive pathways in the package substrate.

12. The microelectronic assembly of claim 11, wherein the first one of the plurality of antenna elements and the second one of the plurality of antenna elements are a same antenna element.

13. The microelectronic assembly of claim 11, wherein the first one of the plurality of antenna elements and the second one of the plurality of antenna elements are different antenna elements.

14. A microelectronic assembly, comprising:
    a package substrate having a first surface and an opposing second surface;
    a transmitter/receiver logic (TRL) die coupled to the first surface of the package substrate;
    a plurality of antenna elements on the second surface of the package substrate; and
    a transmitter/receiver chain (TRC) die having a first surface with first conductive contacts and an opposing second surface with second conductive contacts, wherein the TRC die is embedded in the package substrate, and wherein the second conductive contacts are electrically coupled to the TRL die and to at least one of the plurality of antenna elements via conductive pathways in the package substrate.

15. The microelectronic assembly of claim 14, wherein the TRC die comprises a high power amplifier.

16. The microelectronic assembly of claim 14, wherein the TRC die is a first TRC die and is electrically coupled to a first one of the plurality of antenna elements, and further comprising:
    a second TRC die having a first surface with first conductive contacts and an opposing second surface with second conductive contacts, wherein the second TRC die is embedded in the package substrate, and wherein the second conductive contacts are electrically coupled to the TRL die and to at least a second one of the plurality of antenna elements and the first conductive contacts are electrically coupled to a power plane via conductive pathways in the package substrate.

17. The microelectronic assembly of claim 14, wherein the plurality of antenna elements is to transmit or receive a millimeter wave signal.

18. The microelectronic assembly of claim 14, wherein the plurality of antenna elements is a single-layer antenna array.

19. The microelectronic assembly of claim 14, wherein the plurality of antenna elements comprises:
    a first layer of antenna elements; and
    a second layer of antenna elements, wherein the second layer of antenna elements is separated from the first layer of antenna elements by a dielectric layer.

20. The microelectronic assembly of claim 19, wherein the first layer of antenna elements is capacitively coupled to the second layer of antenna elements.

* * * * *